United States Patent
Lof et al.

(10) Patent No.: US 10,962,891 B2
(45) Date of Patent: Mar. 30, 2021

(54) LITHOGRAPHIC APPARATUS AND DEVICE MANUFACTURING METHOD

(71) Applicant: ASML NETHERLANDS B.V., Veldhoven (NL)

(72) Inventors: Joeri Lof, Eindhoven (NL); Erik Theodorus Maria Bijlaart, Rosmalen (NL); Hans Butler, Best (NL); Sjoerd Nicolaas Lambertus Donders, 's-Hertogenbosch (NL); Christiaan Alexander Hoogendam, Veldhoven (NL); Aleksey Yurievich Kolesnychenko, Helmond (NL); Erik Roelof Loopstra, Heeze (NL); Hendricus Johannes Maria Meijer, Veldhoven (NL); Jeroen Johannes Sophia Maria Mertens, Duizel (NL); Johannes Catharinus Hubertus Mulkens, Maastricht (NL); Roelof Aeilko Siebrand Ritsema, Eindhoven (NL); Frank Van Schaik, Eindhoven (NL); Timotheus Franciscus Sengers, 's-Hertogenbosch (SA); Klaus Simon, Eindhoven (NL); Joannes Theodoor De Smit, Eindhoven (NL); Alexander Straaijer, Eindhoven (NL); Bob Streefkerk, Tilburg (NL); Helmar Van Santen, Amsterdam (NL); Antonius Theodorus Anna Maria Derksen, Eindhoven (NL); Hans Jansen, Eindhoven (NL); Jacobus Johannus Leonardus Hendricus Verspay, Thorn (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 16/707,525

(22) Filed: Dec. 9, 2019

(65) Prior Publication Data
US 2020/0225590 A1    Jul. 16, 2020

Related U.S. Application Data

(60) Continuation of application No. 16/382,483, filed on Apr. 12, 2019, now Pat. No. 10,503,084, which is a (Continued)

(30) Foreign Application Priority Data

Nov. 12, 2002 (EP) .................................. 02257822
Jun. 9, 2003 (EP) .................................. 03253636
Jun. 26, 2003 (EP) .................................. 03254059

(51) Int. Cl.
*G03B 27/52* (2006.01)
*G03F 7/20* (2006.01)

(52) U.S. Cl.
CPC ........ *G03F 7/70858* (2013.01); *G03F 7/7085* (2013.01); *G03F 7/70341* (2013.01); *G03F 7/70716* (2013.01); *G03F 7/70775* (2013.01)

(58) Field of Classification Search
CPC ............. G03F 7/70341; G03F 7/70716; G03F 7/70775; G03F 7/7085; G03F 7/70858
See application file for complete search history.

(56) References Cited

U.S. PATENT DOCUMENTS 3,573,975 A    4/1971  Dhaka et al.
3,648,587 A    3/1972  Stevens
(Continued)

FOREIGN PATENT DOCUMENTS

CN    1341277    3/2002
DE    2474708    7/1981
(Continued)

OTHER PUBLICATIONS

Office Action dated Aug. 9, 2013 issued in U.S. Appl. No. 13/306,532.
(Continued)

Primary Examiner — Peter B Kim
(74) Attorney, Agent, or Firm — Pillsbury Winthrop Shaw Pittman, LLP

(57) ABSTRACT

A lithographic projection apparatus is disclosed in which a space between the projection system and the substrate is filled with a liquid. An edge seal member at least partly surrounds the substrate or other object on a substrate table to prevent liquid loss when edge portions of the substrate or other object are, for example, imaged or illuminated. A lithographic projection apparatus includes a support structure configured to hold a patterning device, the patterning device configured to pattern a beam of radiation according to a desired pattern; a substrate table configured to hold a substrate; a projection system configured to project the patterned beam onto a target portion of the substrate; a liquid supply system configured to provide liquid to a space between the projection system and the substrate; and a shutter configured to isolate the space from the substrate or a space to be occupied by a substrate.

20 Claims, 19 Drawing Sheets

Related U.S. Application Data continuation of application No. 15/185,626, filed on Jun. 17, 2016, now Pat. No. 10,261,428, which is a continuation of application No. 13/615,190, filed on Sep. 13, 2012, now Pat. No. 9,482,966, which is a continuation-in-part of application No. 12/850,472, filed on Aug. 4, 2010, now Pat. No. 8,558,989, which is a continuation of application No. 12/512,754, filed on Jul. 30, 2009, now Pat. No. 9,057,967, which is a division of application No. 11/710,408, filed on Feb. 26, 2007, now Pat. No. 7,593,093, which is a division of application No. 10/705,804, filed on Nov. 12, 2003, now Pat. No. 7,199,858, said application No. 13/615,190 is a continuation-in-part of application No. 12/796,482, filed on Jun. 8, 2010, now Pat. No. 8,446,568, which is a continuation of application No. 11/499,780, filed on Aug. 7, 2006, now Pat. No. 7,932,999, which is a division of application No. 10/831,370, filed on Apr. 26, 2004, now Pat. No. 7,110,081, which is a continuation-in-part of application No. 10/705,785, filed on Nov. 12, 2003, now Pat. No. 7,075,616.

(56) References Cited

U.S. PATENT DOCUMENTS

| | | |
|---|---|---|
| 4,280,054 A | 7/1981 | Guarino |
| 4,346,164 A | 8/1982 | Tabarelli et al. |
| 4,358,198 A | 11/1982 | Moriyama et al. |
| 4,390,273 A | 6/1983 | Loebach et al. |
| 4,396,705 A | 8/1983 | Akeyama et al. |
| 4,465,368 A | 8/1984 | Matsuura et al. |
| 4,480,910 A | 11/1984 | Takanashi et al. |
| 4,509,852 A | 4/1985 | Tabarelli et al. |
| 4,999,669 A | 3/1991 | Sakamoto et al. |
| 5,040,020 A | 8/1991 | Rauschenbach et al. |
| 5,121,256 A | 6/1992 | Corle et al. |
| 5,229,872 A | 7/1993 | Mumola |
| 5,243,195 A | 9/1993 | Nishi |
| 5,296,891 A | 3/1994 | Vogt et al. |
| 5,517,344 A | 5/1996 | Hu et al. |
| 5,523,193 A | 6/1996 | Nelson |
| 5,528,118 A | 6/1996 | Lee |
| 5,610,683 A | 3/1997 | Takahashi |
| 5,623,853 A | 4/1997 | Novak et al. |
| 5,633,968 A | 5/1997 | Sheem |
| 5,668,672 A | 9/1997 | Oomura |
| 5,689,377 A | 11/1997 | Takahashi |
| 5,715,039 A | 2/1998 | Fukuda et al. |
| 5,825,043 A | 10/1998 | Suwa |
| 5,835,275 A | 11/1998 | Takahashi et al. |
| 5,874,820 A | 2/1999 | Lee |
| 5,883,704 A | 3/1999 | Nishi et al. |
| 5,900,354 A | 5/1999 | Batchelder |
| 5,969,441 A | 10/1999 | Loopstra et al. |
| 5,985,495 A | 11/1999 | Okumura et al. |
| 5,997,963 A | 12/1999 | Davison et al. |
| 6,046,792 A | 4/2000 | Van Der Werf et al. |
| 6,078,380 A | 6/2000 | Taniguchi et al. |
| 6,191,429 B1 | 2/2001 | Suwa |
| 6,236,634 B1 | 5/2001 | Lee et al. |
| 6,333,775 B1 | 12/2001 | Haney et al. |
| 6,417,914 B1 | 7/2002 | Li |
| 6,426,790 B1 | 7/2002 | Hayashi |
| 6,560,032 B2 | 5/2003 | Hatano |
| 6,600,547 B2 | 7/2003 | Watson et al. |
| 6,603,130 B1 | 8/2003 | Bisschops et al. |
| 6,633,365 B2 | 10/2003 | Suenaga |
| 6,650,399 B2 | 11/2003 | Baselmans et al. |
| 6,710,849 B2 | 3/2004 | Kwan et al. |
| 6,741,331 B2 | 5/2004 | Boonman et al. |
| 6,762,826 B2 | 7/2004 | Tsukamoto et al. |
| 6,785,006 B2 | 8/2004 | Nishida |
| 6,788,477 B2 | 9/2004 | Lin |
| 6,801,301 B2 | 10/2004 | Miyajima et al. |
| 6,842,256 B2 | 1/2005 | Hill |
| 6,867,844 B2 | 3/2005 | Vogel et al. |
| 6,952,253 B2 | 10/2005 | Lof et al. |
| 6,954,256 B2 | 10/2005 | Flagello et al. |
| 7,009,682 B2 | 3/2006 | Bleeker |
| 7,075,616 B2 | 7/2006 | Derksen et al. |
| 7,081,943 B2 | 7/2006 | Lof et al. |
| 7,098,991 B2 | 8/2006 | Nagasaka et al. |
| 7,110,081 B2 | 9/2006 | Hoogendam et al. |
| 7,119,876 B2 | 10/2006 | Van Der Toorn et al. |
| 7,199,858 B2 | 4/2007 | Lof et al. |
| 7,213,963 B2 | 5/2007 | Lof et al. |
| 7,224,436 B2 | 5/2007 | Derksen et al. |
| 7,227,616 B2 | 6/2007 | Graeupner |
| 7,372,541 B2 | 5/2008 | Lof et al. |
| 7,388,648 B2 | 6/2008 | Lof et al. |
| 7,411,657 B2 | 8/2008 | Ottens et al. |
| 7,545,479 B2 | 6/2009 | Binnard |
| 7,760,324 B2 | 7/2010 | Benschop et al. |
| 7,932,999 B2 | 4/2011 | Hoogendam et al. |
| 7,978,306 B2 | 7/2011 | Ottens et al. |
| 7,982,850 B2 | 7/2011 | Lof et al. |
| 8,018,575 B2 | 9/2011 | Ebihara |
| 8,027,027 B2 | 9/2011 | Ebihara |
| 8,045,136 B2 | 10/2011 | Shibazaki |
| 8,154,708 B2 | 4/2012 | Lof et al. |
| 8,472,002 B2 | 6/2013 | Lof et al. |
| 8,482,845 B2 | 7/2013 | Lof et al. |
| 8,564,763 B2 | 10/2013 | Jacobs et al. |
| 8,797,503 B2 | 8/2014 | Lof et al. |
| 9,091,940 B2 | 7/2015 | Derksen et al. |
| 9,097,987 B2 | 8/2015 | Hoogendam et al. |
| 9,360,765 B2 | 6/2016 | Hoogendam et al. |
| 9,366,972 B2 | 6/2016 | Lof et al. |
| 9,482,966 B2 | 11/2016 | Lof et al. |
| 9,740,107 B2 | 8/2017 | Lof et al. |
| 10,503,084 B2* | 12/2019 | Lof .................. G03F 7/70341 |
| 2001/0038442 A1 | 11/2001 | Hansell et al. |
| 2002/0018190 A1 | 2/2002 | Nogawa et al. |
| 2002/0020821 A1 | 2/2002 | Van Santen et al. |
| 2002/0026878 A1 | 3/2002 | Kwan et al. |
| 2002/0041377 A1 | 4/2002 | Hagiwara et al. |
| 2002/0057423 A1 | 5/2002 | Nogawa |
| 2002/0061469 A1 | 5/2002 | Tanaka |
| 2002/0101574 A1 | 8/2002 | Tsuji |

(56) References Cited

U.S. PATENT DOCUMENTS

| | | |
|---|---|---|
| 2002/0118370 A1 | 8/2002 | Nishida |
| 2002/0145717 A1 | 10/2002 | Baselmans et al. |
| 2002/0163629 A1 | 11/2002 | Switkes et al. |
| 2002/0167642 A1 | 11/2002 | Jones et al. |
| 2002/0167651 A1 | 11/2002 | Boonman et al. |
| 2003/0030916 A1 | 2/2003 | Suenaga |
| 2003/0071982 A1 | 4/2003 | Miyajima et al. |
| 2003/0095244 A1 | 5/2003 | Komatsu |
| 2003/0123040 A1 | 7/2003 | Almogy |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0036850 A1* | 2/2004 | Tsukamoto ............ G03F 7/707 355/72 |
| 2004/0069329 A1 | 4/2004 | de Larios et al. |
| 2004/0075895 A1 | 4/2004 | Lin |
| 2004/0123351 A1 | 4/2004 | Krautschik |
| 2004/0109237 A1 | 6/2004 | Epple et al. |
| 2004/0114117 A1 | 6/2004 | Bleeker |
| 2004/0114124 A1 | 6/2004 | Hoeks et al. |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0135099 A1 | 7/2004 | Simon et al. |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2004/0269808 | 12/2004 | Sewell |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048223 A1 | 3/2005 | Pawloski et al. |
| 2005/0052632 A1 | 3/2005 | Miyajima |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0099635 A1 | 5/2005 | Kakuchi et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0122505 A1 | 6/2005 | Miyajima |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Maria Zaal et al. |
| 2005/0225734 A1 | 10/2005 | De Smit et al. |
| 2005/0225737 A1 | 10/2005 | Weissenrieder et al. |
| 2005/0231694 A1 | 10/2005 | Kolesynchenko et al. |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259234 A1 | 11/2005 | Hirukawa et al. |
| 2005/0264778 A1 | 12/2005 | Lof et al. |
| 2005/0270505 A1 | 12/2005 | Smith |
| 2006/0023186 A1 | 2/2006 | Binnard |
| 2006/0103832 A1 | 5/2006 | Hazelton et al. |
| 2006/0114445 A1 | 6/2006 | Ebihara |
| 2006/0132740 A1 | 6/2006 | Ebihara |
| 2006/0170891 A1 | 8/2006 | Nishinaga et al. |
| 2006/0209414 A1 | 9/2006 | Van Santen et al. |
| 2006/0261288 A1 | 11/2006 | Van Santen |
| 2006/0268250 A1 | 11/2006 | Hoogendam et al. |
| 2006/0285100 A1 | 12/2006 | Hamatani et al. |
| 2007/0076181 A1 | 4/2007 | Ishii et al. |
| 2007/0076182 A1 | 4/2007 | Hazelton et al. |
| 2007/0132970 A1 | 6/2007 | Lof et al. |
| 2007/0132979 A1 | 6/2007 | Lof et al. |
| 2007/0177125 A1 | 8/2007 | Shibazaki |
| 2008/0278697 A1 | 11/2008 | Ottens et al. |
| 2009/0279061 A1 | 11/2009 | Jacobs et al. |
| 2013/0250270 A1 | 9/2013 | Lof et al. |
| 2019/0212661 A1* | 7/2019 | Lof .................. G03F 7/7085 |

FOREIGN PATENT DOCUMENTS

| | | |
|---|---|---|
| DE | 206 607 | 2/1984 |
| DE | 224448 | 7/1985 |
| DE | 03/085708 | 10/2003 |
| EP | 0023231 | 2/1981 |
| EP | 0418427 | 3/1991 |
| EP | 0 605 103 | 7/1994 |
| EP | 0 834 773 | 4/1998 |
| EP | 1039511 | 9/2000 |
| EP | 1 477 856 | 11/2004 |
| EP | 1 571 697 | 9/2005 |
| EP | 1 571 701 | 9/2005 |
| EP | 1 628 329 | 2/2006 |
| EP | 1 628 330 | 2/2006 |
| FR | 2474708 | 7/1981 |
| JP | 57-153433 | 9/1982 |
| JP | 58-202448 | 11/1983 |
| JP | 59-019912 | 2/1984 |
| JP | 62-065326 | 3/1987 |
| JP | 62-121417 | 6/1987 |
| JP | 63-157419 | 6/1988 |

(56) References Cited

FOREIGN PATENT DOCUMENTS

| | | |
|---|---|---|
| JP | 04-305915 | 10/1992 |
| JP | 04-305917 | 10/1992 |
| JP | 5-62877 | 3/1993 |
| JP | 5-251544 | 9/1993 |
| JP | 5-304072 | 11/1993 |
| JP | 6-84757 | 3/1994 |
| JP | 06-124873 | 5/1994 |
| JP | 6-168866 | 6/1994 |
| JP | 07-132262 | 5/1995 |
| JP | 07-220990 | 8/1995 |
| JP | 08-316125 | 11/1996 |
| JP | 09-066429 | 3/1997 |
| JP | 09-184787 | 7/1997 |
| JP | 10-92728 | 4/1998 |
| JP | 10-135316 | 5/1998 |
| JP | 10-154659 | 6/1998 |
| JP | 10-160582 | 6/1998 |
| JP | 10-228661 | 8/1998 |
| JP | 10-255319 | 9/1998 |
| JP | 10-303114 | 11/1998 |
| JP | 10-340846 | 12/1998 |
| JP | 11-126112 | 5/1999 |
| JP | 11-176727 | 7/1999 |
| JP | 11-239758 | 9/1999 |
| JP | 11297789 A * | 10/1999 |
| JP | 2000-058436 | 2/2000 |
| JP | 2000-097616 | 4/2000 |
| JP | 2000-331931 | 11/2000 |
| JP | 2001-091849 | 4/2001 |
| JP | 2002-071513 | 3/2002 |
| JP | 2002-071514 | 3/2002 |
| JP | 2002-513856 | 5/2002 |
| JP | 2002-170754 | 6/2002 |
| JP | 2002-170765 | 6/2002 |
| JP | 2002-246309 | 8/2002 |
| JP | 2002-250678 | 9/2002 |
| JP | 2002-296005 | 10/2002 |
| JP | 2002-358556 | 12/2002 |
| JP | 2003-332213 | 11/2003 |
| JP | 2004/019128 | 3/2004 |
| JP | 2004 165666 | 6/2004 |
| JP | 2004-193252 | 7/2004 |
| JP | 2004 289126 | 10/2004 |
| JP | 2005-12201 | 1/2005 |
| JP | 2005-101488 | 4/2005 |
| JP | 2005-223275 | 8/2005 |
| JP | 2005-277363 | 10/2005 |
| JP | 2006-523377 | 10/2006 |
| JP | 2007-142460 | 6/2007 |
| JP | 4362867 | 11/2009 |
| JP | 2010-135857 | 6/2010 |
| WO | 98/33096 | 7/1998 |
| WO | 98/38597 A2 | 9/1998 |
| WO | 98/38597 A3 | 9/1998 |
| WO | 98/40791 | 9/1998 |
| WO | 99/49504 | 9/1999 |
| WO | 99/060361 | 11/1999 |
| WO | 01/22480 | 3/2001 |
| WO | 02/063613 | 8/2002 |
| WO | 02/090905 | 11/2002 |
| WO | 02/091078 | 11/2002 |
| WO | 03/077036 | 9/2003 |
| WO | 03/077037 | 9/2003 |
| WO | 03/085708 | 10/2003 |
| WO | 04/019128 | 3/2004 |
| WO | 2004/053596 | 6/2004 |
| WO | 2004/053950 | 6/2004 |
| WO | 2004/053951 | 6/2004 |
| WO | 2004/053952 | 6/2004 |
| WO | 2004/053953 | 6/2004 |
| WO | 2004/053954 | 6/2004 |
| WO | 2004/053955 | 6/2004 |
| WO | 2004/053956 | 6/2004 |
| WO | 2004/053957 | 6/2004 |
| WO | 2004/053958 | 6/2004 |
| WO | 2004/053959 | 6/2004 |
| WO | 2004/055803 | 7/2004 |
| WO | 2004/057589 | 7/2004 |
| WO | 2004/057590 | 7/2004 |
| WO | 2004/077154 | 9/2004 |
| WO | 2004/081666 | 9/2004 |
| WO | 2004/090577 | 10/2004 |
| WO | 2004/090633 | 10/2004 |
| WO | 2004/090634 | 10/2004 |
| WO | 2004/092830 | 10/2004 |
| WO | 2004/092833 | 10/2004 |
| WO | 2004/093130 | 10/2004 |
| WO | 2004/093159 | 10/2004 |
| WO | 2004/093160 | 10/2004 |
| WO | 2004/095135 | 11/2004 |
| WO | 2004/105107 | 12/2004 |
| WO | 2004/112108 | 12/2004 |
| WO | 2005/001432 | 1/2005 |
| WO | 2005/001572 | 1/2005 |
| WO | 2005/003864 | 1/2005 |
| WO | 2005/006026 | 1/2005 |
| WO | 2005/008339 | 1/2005 |
| WO | 2005/013008 | 2/2005 |
| WO | 2005/015283 | 2/2005 |
| WO | 2005/017625 | 2/2005 |
| WO | 2005/019935 | 3/2005 |
| WO | 2005/022266 | 3/2005 |
| WO | 2005/022616 | 3/2005 |
| WO | 2005/024325 | 3/2005 |
| WO | 2005/024517 | 3/2005 |
| WO | 2005/034174 | 4/2005 |
| WO | 2005/050324 | 6/2005 |
| WO | 2005/054953 | 6/2005 |
| WO | 2005/054955 | 6/2005 |
| WO | 2005/059617 | 6/2005 |
| WO | 2005/059618 | 6/2005 |
| WO | 2005/059645 | 6/2005 |
| WO | 2005/059654 | 6/2005 |
| WO | 2005/062128 | 7/2005 |
| WO | 2005/064400 | 7/2005 |
| WO | 2005/064405 | 7/2005 |
| WO | 2005/069055 | 7/2005 |
| WO | 2005/069078 | 7/2005 |
| WO | 2005/069081 | 7/2005 |
| WO | 2005/071491 | 8/2005 |
| WO | 2005/074606 | 8/2005 |
| WO | 2005/076084 | 8/2005 |
| WO | 2005/081030 | 9/2005 |
| WO | 2005/081067 | 9/2005 |
| WO | 2005/098504 | 10/2005 |
| WO | 2005/098505 | 10/2005 |
| WO | 2005/098506 | 10/2005 |
| WO | 2005/106589 | 11/2005 |
| WO | 2005/111689 | 11/2005 |
| WO | WO 2005/111722 | 11/2005 |
| WO | 2005/119368 | 12/2005 |
| WO | 2005/119369 | 12/2005 |

OTHER PUBLICATIONS

Office Action dated Aug. 8, 2013 issued in U.S. Appl. No. 13/194,136.
Office Action dated Aug. 8, 2013 issued in U.S. Appl. No. 13/195,248.
Notification of Completion of Formalities for Registration dated Jul. 1, 2013 issued in Chinese Patent Application No. 201110083335.0.
Japanese Office Action dated Jun. 12, 2013 in Japanese Patent Application No. 2012-027270.
Japanese Office Action dated May 31, 2013 in Japanese Patent Application No. 2011-281445.
Office Action dated Jun. 20, 2013 issued in U.S. Appl. No. 12/512,754.
Japanese Office Action dated Nov. 8, 2013 in Japanese Patent Application No. 2012-066781.
Singapore Search Report and Written Opinion dated Nov. 4, 2013 issued in Singapore Patent Application No. 201005011-0.
Office Action dated Oct. 25, 2013 issued in U.S. Appl. No. 13/722,830.
Office Action dated Sep. 9, 2013 issued in U.S. Appl. No. 13/149,404.
Office Action dated Nov. 20, 2013 issued in U.S. Appl. No. 12/512,754.

(56) References Cited

OTHER PUBLICATIONS

Office Action dated Nov. 15, 2013 issued in U.S. Appl. No. 13/194,136.
Office Action dated Nov. 14, 2013 issued in U.S. Appl. No. 13/306,532.
Office Action dated Nov. 12, 2013 Issued in U.S. Appl. No. 13/195,248.
Office Action dated Aprii 4, 2014 issued in U.S. Appl. No. 13/306,532.
Office Action dated Apr. 4, 2014 issued in U.S. Appl. No. 13/195,248.
Office Action dated Apr. 3, 2014 issued in U.S. Appl. No. 12/512,754.
Office Action dated Apr. 3, 2014 issued in U.S. Appl. No. 13/194,136.
Office Action dated Feb. 24, 2014 issued in U.S. Appl. No. 13/722,830.
Office Action dated Mar. 24, 2014 issued in U.S. Appl. No. 13/866,879.
Information Disclosure Statement filed Dec. 1, 2006 for U.S. Appl. No. 11/606,913.
Information Disclosure Statement filed Dec. 1, 2006 for U.S. Appl. No. 11/606,909.
Office Action dated Apr. 6, 2007 issued for U.S. Appl. No. 11/606,913.
Office Action dated Nov. 6, 2006 issued for U.S. Appl. No, 11/002,900.
Office Action dated May 22, 2006 issued for U.S. Appl. No. 11/002,900.
Third Preliminary Amendment dated Aug. 17, 2005 for U.S. Appl. No. 11/147,285.
Office Action dated Sep. 29, 2008 issued for U.S. Appl. No. 11/606,909.
Office Action dated Dec. 28, 2007 Issued for U.S. Appl. No. 11/606,913.
Office Action dated Sep. 17, 2007 issued for U.S. Appl. No. 11/002,900.
Emerging Lithographic Technologies VI, Proceedings of SPIE, vol. 4688 (2002), "Semiconductor Foundry, Lithography, and Partners", B.J. Lin, pp. 11-24.
Optical Microlithography XV, Proceedings of SPIE, vol. 4691 (2002), "Resolution Enhancement of 157 nm Lithography by Liquid immersion", M. Switkes et al., pp. 459-465.
J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.
EP Search Report for EP 02257938 dated Sep. 25, 2003.
M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Scl. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al,, "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future FAB International, vol. 15, Jul. 11, 2003.
H. Kawata et al., "Fabrication of 0.2μm Fine Patterns Using Optical Projection Lithography with an Oil Immersion Lens", Jpn. J. Appl. Phys. vol. 31 (1992), pp. 4174-4177.
G. Owen et al., "1/8μm Optical Lithography", J. Vac. Sci. Technol. B., vol. 10, No. 6, Nov./Dec. 1992, pp. 3032-3036.
S. Owa and N. Nagasaka, "Potential Performance and Feasibility of Immersion Lithography", NGL Workshop 2003, Jul. 10, 2003, Slide Nos. 1-33.
H. Hogan, "New Semiconductor Lithography Makes a Splash", Photonics Spectra, Photonics TechnologyWorld, Oct. 2003 Edition, pp. 1-3.
European Search Report dated May 3, 2004 for European patent application No. EP 03257068.1.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The k3 coefficient in nonparaxial λ/NA scaling equations for resolution, depth of focus, and immersion iithography, *J. Microlith., Microfab., Microsyst.* 1(1)7-12 (2002).
European Search Report completed Aug. 17, 2004 for European patent application No. EP 03 25 7068.
Examination Report dated Mar. 28, 2008 for European patent application No. 03 257 072.3.
English language translation of Japanese Office Action dated Jul. 12, 2007 in Japanese Patent Application No. 2004-169275.
Office Action dated Dec. 7, 2009 in European patent application No. EP 03 257 071.5.
U.S. Appl. No. 60/462,499, titled "Landing Pad for Immersion Lithography," filed Apr. 11, 2003 in the United States Patent and Trademark Office.
European Patent Office Communication dated Jan. 3, 2012 issued in European Patent Application No. 04 253 354.7.
Chinese Office Action dated Dec. 7, 2011 issued in Chinese Patent Application No. 200910002111.5.
European Office Action dated Apr. 12, 2012 issued in European Patent Application No. 03 257 070.0.
Office Action dated May 24, 2012 in U.S. Appl. No. 12/512,754.
Office Action dated Jun. 8, 2012 in U.S. Appl. No. 13/149,404.
Office Action dated Jun. 14, 2012 in U.S. Appl. No. 12/698,938.
Japanese Office Action dated Jul. 24, 2012 in Japanese Patent Application No. 2011-243516.
Office Action dated Sep. 27, 2012 in U.S. Appl. No. 12/698,932.
Office Action dated Oct. 15, 2012 in U.S. Appl. No. 13/149,404.
Office Action dated Oct. 24, 2012 in U.S. Appl. No. 12/512,754.
Japanese Office Action dated Nov. 6, 2012 in Japanese Patent Application No. 2011-243513.
Office Action dated Nov. 26, 2012 in U.S. Appl. No. 12/698,938.
Office Action dated Sep. 25, 2012 in U.S. Appl. No. 12/850,472.
Office Action dated Mar. 4, 2013 in U.S. Appl. No. 12/850,472.
Office Action dated Aug. 21, 2014 issued in U.S. Appl. No. 13/194,136.
Office Action dated Aug. 21, 2014 issued in U.S. Appl. No. 13/306,532.
Office Action dated Dec. 31, 2014 Issued in U.S. Appl. No. 13/692,865.
Office Action dated Mar. 18, 2015 issued in U.S. Appl. No. 13/306,532.
Office Action dated Oct. 7, 2015 issued in U.S. Appl. No. 14/816,977.
Office Action dated Oct. 7, 2015 issued in U.S. Appl. No. 14/701,236.
Office Action dated Aug. 5, 2015 issued in U.S. Appl. No. 13/306,532.
V. LeRoux et al., "A reflection lithography using multicharged ions," Microelectronic Engineering, vol. 57-58, pp. 239-245 (Sep. 2001).

(56) References Cited

OTHER PUBLICATIONS

Ivor Brodie et al., "A Multiple-Electron-Beam Exposure System for High-Throughput, Direct-Write Submicrometer Lithography," IEEE Transactions on Electron Devices, vol. EDS-28, No. 11, pp. 1422-1428 (Nov. 1981).

Yuen-Chuen Chan et al., "Development and applications of a laser writing lithography system for maskless patterning," Opt. Eng., vol. 37, No. 9, pp. 2521-2530 (Sep. 1998).

W. Häβler-Grohne et al., "An electron optical metrology system for pattern placement measurements," Meas. Sci. Technol., vol. 9, pp. 1120-1128 (1998).

Shoji Maruo et al., "Submicron stereolithography for the production of freely movable mechanisms by using single-photon polymerization," Sensors and Actuators A, vol. 100, pp. 70-76 (Aug. 2002).

F. Abboud et al., "Evaluation of the MEBES® 4500 reticle writer to commercial requirements of 250 nm design rule IC devices," Proc of SPIE, vol. 2793, pp. 438-451 (Jul. 24, 1996).

Toru Tojo et al., "Advanced electron beam writing system EX-11 for next-generation mask fabrication," Proc. of SPIE, vol. 3748, pp. 416-425 (Sep. 1999).

Yoshiyuki Tomita et al., "A surface motor-driven precise positioning system," Precision Engineering, vol. 16, No. 3, pp. 184-191 (Jul. 1994).

Chang-Woo Lee et al., "An ultraprecision stage for alignment of wafers in advanced microlithography," Precision Engineering, vol. 21, No. 2/3, pp. 113-122, (Sep./ Dec. 1997).

H. Löschner et al., "Ion projection lithography for vacuum microelectronics," J. Vac. Sci. Technol. B, vol. 11, No. 2, pp. 487-492 (Mar./Apr. 1993).

Hans Loeschner et al., "Large-Field Ion-Optics for Projection and Proximity Printing and for Mask-Less Lithography (ML2)," Proc. of SPIE, vol. 4688, pp. 595-606 (Jul. 2002).

Won-jong Kim et al., "Modeling and Vector Control of Planar Magnetic Levitator," IEEE Transactions on Industry Applications, vol. 34, No. 6, pp. 1254-1262 (Nov./ Dec. 1998).

Rodney Kendall et al., "A servo guided X—Y—theta stage for electron beam lithography," J. Vac. Sol. Technol. B, vol. 9, No. 6, pp. 3019-3023 (Nov./Dec. 1991).

T. Kato et al., "Submicron pattern fabrication by focused ion beams," J. Vac. Sci. Technol. B, vol. 3, No. 1, pp. 50-53 (Jan./Feb. 1985).

Hans C. Pfeiffer, "PREVAIL: Proof-of-Concept System and Results," Microelectronic Engineering, vol. 53, pp. 61-66 (2000).

L.M. Buchmann et al., "Lithography with High Depth of Focus by an Ion Projection System," Journal of Microelectromechanical Systems, vol. 1, No. 3, pp. 116-120 (Sep. 1992).

T.C. Bailey et al., "Step and Flash Imprint Lithography: An Efficient Nanoscale Printing Technology," Journal of Photopolymer Science and Technology, vol. 15, No. 3, pp. 481-486 (Jan. 2002).

Oui-Serg Kim et al., "Positioning Performance and Straightness Error Compensation of the Magnetic Levitation Stage Supported by the Linear Magnetic Bearing," IEEE Transactions on Industrial Electronics, vol. 50, No. 2, pp. 374-378 (Apr. 2003).

Ampere A. Tseng et al., "Electron Beam Lithography in Nanoscale Fabrication: Recent Development," IEEE Transactions on Electronics Packaging Manufacturing, vol. 26, No. 2, pp. 141-149 (Apr. 2003).

Qing Ji, "Maskless, Resistless Ion Beam Lithography Processes," University of Berkeley, 128 pages (Spring 2003).

Rik Kneppers, "HP Laser Interferometers," Vaisala News, vol. 151, pp. 34-37 (1999).

R.S. Dhaliwal et al., "PREVAIL—Electron projection technology approach for next-generation lithography," IBM J. Res. & Dev., vol. 45, No. 5, pp. 615-638 (Sep. 2001).

Kazuaki Suzuki, "EPL Technology Development," Proc. of SPIE, vol. 4754, pp. 775-789 (Jul. 2002).

G. Stengl et al., "Current status of Ion Projection Lithography," Proc. of SPIE, vol. 537, pp. 138-145 (1985).

Ernst Thielicke et al., "Microactuators and their technologies," Mechatronics, vol. 10, pp. 431-455 (2000).

G. Stangl et al., "Submicron Lithography and DUV-Master Masks Made by ion Projection Lithography," Microelectronic Engineering, vol. 3, pp. 167-171 (1985).

G. Stengl et al., "Ion projection lithography machine IPLM01: a new tool for sub-0.5-micron modification of materials," J. Vac. Sci. Technol. B, vol. 4, No. 1, pp. 194-200 (Jan./Feb. 1986).

Carl G. Chen et al., "Nanometer accurate Grating Fabrication with Scanning Beam Interference Lithography," Proc. of SPIE, vol. 4936, pp. 126-134 (Nov. 2002).

G. de Zwart et al., "Performance of a Step and Scan System for DUV Lithography," SPIE Symposium on Optical Microlithography in Santa Clara, pp. 0-18 (Mar. 1997).

Jan Mulkens et al., "ASML Optical Lithography Solutions for 65 nm and 45 nm Node," Semicon Japan, pp. 1-29, (Dec. 5, 2003).

Arnold et al., "193nm Immersion Lithography," International Sematech Litho Forum, Slides 122, (Jan. 28, 2004).

Office Action dated Jun. 29, 2016 issued in U.S. Appl. No. 15/167,357.

Office Action dated Oct. 20, 2016 issued in U.S. Appl. No. 15/178,522.

Office Action dated Jan. 18, 2017 issued in U.S. Appl. No. 14/743,775.

U.S. Office Action dated Jun. 2, 2017 issued in U.S. Appl. No. 15/448,438.

Notice of Allowance dated Sep. 28, 2017 in U.S. Appl. No. 15/448,438.

Final Office Action dated Dec. 27, 2017 issued in U.S. Appl. No. 14/743,775.

Non-Final Office Action dated Apr. 19, 2018 issued in U.S. Appl. No. 15/653,435.

Non-Final Office Action dated Apr. 27, 2018 issued in U.S. Appl. No. 15/862,604.

Non-Final Office Action dated May 14, 2018 issued in U.S. Appl. No. 14/937,724.

Final Office Action dated Sep. 19, 2018 issued in U.S. Appl. No. 15/862,604.

Notice of Allowance dated Sep. 21, 2018 in U.S. Appl. No. 14/743,775.

Notice of Allowance dated Sep. 13, 2018 in U.S. Appl. No. 15/653,435.

Notice of Allowance dated Sep. 6, 2018 in U.S. Appl. No. 15/385,584.

Office Action dated Jan. 4, 2019 issued in U.S. Appl. No. 15/862,604.

Notice of Allowance mailed Dec. 31, 2018 in U.S. Appl. No. 14/937,724.

Notice of Allowance issued in corresponding U.S. Appl. No. 16/229,102, dated Jun. 12, 2019.

Office Action issued in corresponding U.S. Appl. No. 16/245,400, dated Jun. 11, 2019.

Office Action issued in corresponding U.S. Appl. No. 16/286,885, dated Jun. 27, 2019.

* cited by examiner

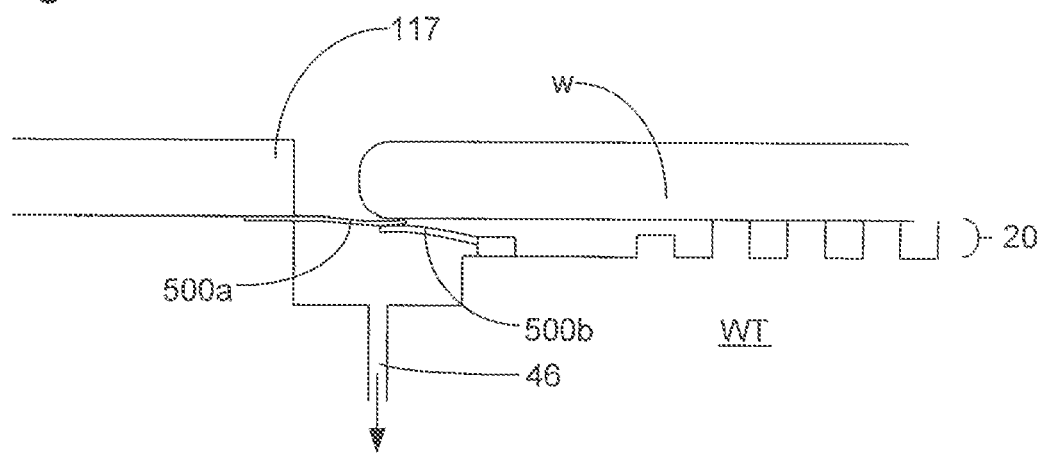
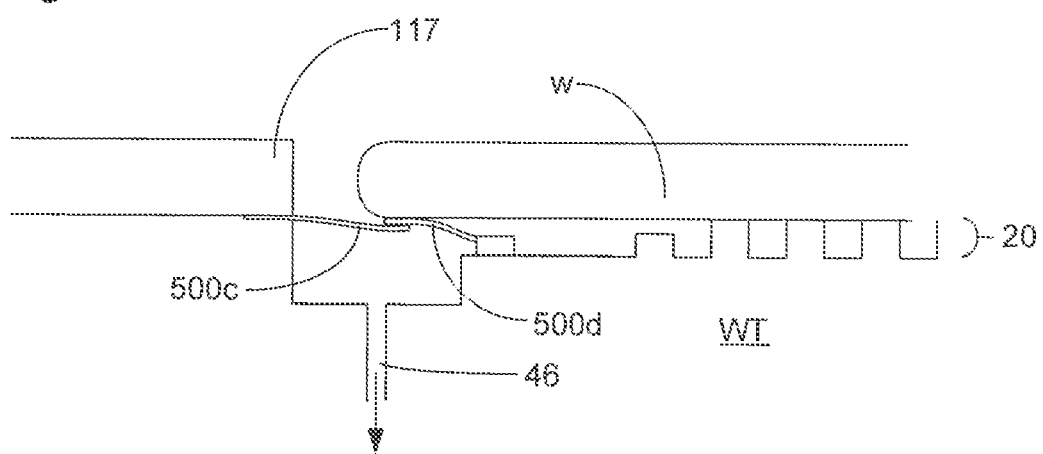

LITHOGRAPHIC APPARATUS AND DEVICE MANUFACTURING METHOD

This application is a continuation of U.S. patent application Ser. No. 16/382,483, filed Apr. 12, 2019, now allowed, which is a continuation of U.S. patent application Ser. No. 15/185,626, filed Jun. 17, 2016, now U.S. Pat. No. 10,261,428, which is a continuation of U.S. patent application Ser. No. 13/615,190, filed Sep. 13, 2012, now U.S. Pat. No. 9,482,966, which is a continuation-in-part application of (i) U.S. patent application Ser. No. 12/850,472, filed Aug. 4, 2010, now U.S. Pat. No. 8,558,989, which is a continuation of U.S. patent application Ser. No. 12/512,754, filed on Jul. 30, 2009, now U.S. Pat. No. 9,057,967, which is a divisional application of U.S. patent application Ser. No. 11/710,408, filed on Feb. 26, 2007, now U.S. Pat. No. 7,593,093, which is a divisional application of U.S. patent application Ser. No. 10/705,804, filed Nov. 12, 2003, now U.S. Pat. No. 7,199,858, which claims priority from European patent applications EP 02257822.3, filed Nov. 12, 2002, and EP 03253636.9, filed Jun. 9, 2003, and of (ii) U.S. patent application Ser. No. 12/796,482, filed Jun. 8, 2010, now U.S. Pat. No. 8,446,568, which is a continuation application of U.S. patent application Ser. No. 11/499,780, filed Aug. 7, 2006, now U.S. Pat. No. 7,932,999, which is a divisional application of U.S. patent application Ser. No. 10/831,370, filed Apr. 26, 2004, now U.S. Pat. No. 7,110,081, which is a continuation-in-part patent application of U.S. patent application Ser. No. 10/705,785, filed Nov. 12, 2003, now U.S. Pat. No. 7,075,616, which claims priority from European patent applications EP 02257822.3, filed Nov. 12, 2002, EP 03253636.9, filed Jun. 9, 2003, and EP 03254059.3, filed Jun. 26, 2003, each of the foregoing applications is incorporated herein in its entirety by reference.

FIELD

The present invention relates to immersion lithography.

BACKGROUND

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such a patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791, incorporated herein by reference.

It has been proposed to immerse the substrate in a lithographic projection apparatus in a liquid having a relatively high refractive index, e.g. water, so as to fill a space between the final optical element of the projection lens and the substrate. The point of this is to enable imaging of smaller features because the exposure radiation will have a shorter wavelength in the liquid than in air or in a vacuum. (The effect of the liquid may also be regarded as increasing the effective NA of the system).

However, submersing the substrate or substrate and substrate table in a bath of liquid (see, for example, U.S. Pat. No. 4,509,852, hereby incorporated in its entirety by reference) may mean that there is a large body of liquid that must be accelerated during a scanning exposure. This may require additional or more powerful motors and turbulence in the liquid may lead to undesirable and unpredictable effects.

One of the solutions proposed is for a liquid supply system to provide liquid on only a localized area of the substrate and in between the final element of the projection lens and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 22 and 23, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 23 shows the arrangement schematically in which liquid is supplied via inlet IN and is taken up on the other side of the element by outlet OUT which is connected to a low pressure source. In the illustration of FIG. 22 the liquid is supplied along the direction of movement of the substrate relative to the final element, though this does not need to be the case. Various orientations and numbers of in- and out-lets positioned around the final element are possible, one example is illustrated in FIG. 23 in which four sets of an inlet with an outlet on either side are provided in a regular pattern around the final element.

SUMMARY

Difficulties in large loss of liquid from the liquid supply system can arise with the system described above and any other systems that provide liquid on only a localized area of the substrate and between the projection system and the substrate when the localized area crosses over an edge of the substrate or other object.

Accordingly, it may be advantageous to provide, for example, a lithographic projection apparatus in which liquid loss from the supply system is minimized during passage over an edge portion of the substrate or other object.

According to an aspect, there is provided a lithographic projection apparatus comprising:

a support structure configured to hold a patterning device, the patterning device configured to pattern a beam of radiation according to a desired pattern;

a projection system configured to project the patterned beam onto a target portion of a substrate;

a substrate table configured to hold the substrate, the substrate table comprising an edge seal member configured to at least partly surround an edge of at least one of the substrate and an object positioned on the substrate table and to provide a primary surface facing the projection system substantially co-planar with a primary surface of the at least one of the substrate and the object; and a liquid supply system configured to provide a liquid, through which the beam is to be projected, in a space between the projection system and the at least one of the substrate and the object, wherein the liquid supply system provides liquid to a localized area of at least one of the object, the edge seal member and the substrate.

Where applied to a substrate, the edge seal member surrounds a position on the substrate table where, in use, the substrate is to be placed, e.g., surrounding the chuck or pimple table on which the substrate is held. In this way the substrate can be positioned closely adjacent to the edge of the edge seal member such that as an edge of the substrate moves under the projection system there is no sudden loss of liquid from the space because there is no large gap for the liquid to flow through. The edge seal member may be an integral part of the substrate table or may be moveably mounted relative to the remainder of the substrate table. In the latter case, it can be arranged such that the gap between the edge seal member and the substrate can be varied and/or the height of the primary surface of the edge seal member can be varied to accommodate variations in substrate height or thickness, i.e., to ensure that the primary surface of the edge seal member is substantially coplanar with the primary surface of the substrate. The above may also be applied to an object on the substrate table such as a sensor, e.g., a projection beam sensor.

In an embodiment, the substrate table comprises a gap seal member configured to abut or at least partly overlap, in the direction of the optical axis, both the edge seal member and the at least one of the substrate and the object. For example, in this way the gap between the edge seal member and a substrate (or an object), which is due to the size mismatch between the inner edge of the edge seal member and the outer edge of the substrate or object (which is necessary to accommodate slight variations in the diameter of the substrate or object), can be covered by the gap seal member. This further reduces the amount of liquid loss into the gap between the edge seal member and the substrate or object. In an embodiment, the gap seal member is configured to be in contact with the primary surfaces, thereby spanning the gap between the edge seal member and the at least one of the substrate and the object.

If the gap seal member has inner and outer edges, at least one of the edges may be tapered such that the thickness of the gap seal member facing away from the edge seal member or the at least one of the substrate and the object decreases towards the edge of the gap seal member. This helps the liquid supply system move smoothly over the gap between the substrate or object and the edge seal member.

A way to hold the gap seal member removably in place is to provide the substrate table with a vacuum port in the primary surface of the edge seal member.

Another way to minimize the amount of liquid which escapes into the gap between the edge seal member and the substrate or object is to provide the substrate table with a hydrophobic layer facing edge portions of the edge seal member and the substrate or object on an opposite side of the edge seal member and the substrate or object to the projection system. Such a hydrophobic layer may be any material which exhibits hydrophobic properties, for example Teflon, silicon rubber or other plastics materials. Inorganic coatings are generally desired because they have better radiation resistance than organic coatings. In an embodiment, the liquid has a contact angle of greater than 90° with the hydrophobic layer. This reduces the chances of liquid seeping into the gap.

According to an aspect, there is provided a lithographic projection apparatus comprising:
  a support structure configured to hold a patterning device, the patterning device configured to pattern a beam of radiation according to a desired pattern;
  a projection system configured to project the patterned beam onto a target portion of a substrate;
  a substrate table configured to hold the substrate, the substrate table comprising:
    an edge seal member configured to at least partly surround an edge of at least one of the substrate and an object positioned on the substrate table, and
    a further edge seal member configured to extend across the gap between the edge seal member and the at least one of the substrate and the object and to be in contact with the at least one of the substrate and the object; and
  a liquid supply system configured to provide a liquid, through which the beam is to be projected, in a space between the projection system and the at least one of the substrate and the object.

In this way the gap between the edge seal member and the substrate or object is closed off so that there is no gap between the edge seal member and the substrate or object through which liquid from the liquid supply system can pass. This is particularly so if the further edge seal member is flexible in which case a better seal between the further edge seal member and the substrate or object is achievable.

In an embodiment, the flexible further edge seal member is attached to the edge seal member and has a port, connected to a vacuum source, adjacent its end distal from the edge seal member, such that on actuation of the vacuum source, the flexible further edge seal member is deflectable upwards to contact against the substrate or object to form a seal between the flexible further edge seal member and the substrate or object due to the force generated by the vacuum source acting on the substrate or object. This allows the flexible further edge seal member to be actuatable to contact with the substrate or object and to be deactuatable so that it falls away from the substrate or object. The application of the vacuum ensures a good seal between the flexible further edge seal member and the substrate or object.

In another embodiment, the flexible further edge seal member is disposed between the edge seal member and the substrate or object and with a surface substantially co-planar with the primary surfaces of the edge seal member and the substrate or object. In this way the gap between the edge seal member and the substrate or object can be sealed such that only small amounts of liquid can pass into the gap. In an embodiment, the flexible further edge seal member is shaped to contact the substrate or object on the surface opposite its primary surface and may be effective to apply a force to the substrate or the object away from the substrate table when the substrate or object is held on the substrate table. In the case of the substrate, the flexible further edge seal member in this way may help in the removal of the substrate from the substrate table after exposure of the substrate.

According to an aspect, there is provided a lithographic projection apparatus comprising:
  a support structure configured to hold a patterning device, the patterning device configured to pattern a beam of radiation according to a desired pattern;
  a projection system configured to project the patterned beam onto a target portion of a substrate;
  a substrate table configured to hold the substrate, the substrate table comprising:
    an edge seal member configured to at least partly surround an edge of at least one of the substrate and an object positioned on the substrate table, and
    at least one of a vacuum port and a liquid supply port positioned to provide respectively a vacuum or liquid to the gap between the edge seal member and the at least one of the substrate and the object on a side opposite the projection system; and
  a liquid supply system configured to provide a liquid, through which the beam is to be projected, in a space between the projection system and the at least one of the substrate and the object.

In the case of a liquid supply port, no liquid can find its way into the gap between the edge seal member and the substrate or object from the space between the projection system and the substrate or object, because that gap is already filled with liquid. If the vacuum alternative is used, any liquid which does find its way into that gap will be removed and may be recycled. The provision of vacuum is advantageous when a gas seal member of a liquid supply system is used to keep the liquid in the space between the projection system and the substrate or object. This is because it can not only remove any liquid passing into the gap but also any gas from the gas seal member.

Further, there may be provided a channel positioned radially inwardly of the vacuum port, the channel being connected to a gas source such that on actuation of the vacuum a flow of gas radially outwardly from the channel toward the vacuum can be established. Such a flow of gas can be used to ensure that any liquid which does reach the non-immersed side of the substrate or object is caught in the gas flow and transported away towards the vacuum.

According to an aspect, there is provided a lithographic projection apparatus comprising:
  a support structure configured to hold a patterning device, the patterning device configured to pattern a beam of radiation according to a desired pattern;
  a projection system configured to project the patterned beam onto a target portion of a substrate;
  a substrate table configured to hold the substrate, the substrate table comprising a support surface configured to support an intermediary plate between the projection system and at least one of the substrate and an object positioned on the substrate table and not in contact with the at least one of the substrate and the object; and
  a liquid supply system configured to provide a liquid, through which the beam is to be projected, in a space between the projection system and the at least one of the substrate and the object.

In this way an intermediary plate can be used which is of an overall size larger than the substrate or object so that, for example, during imaging of edge portions of the substrate or object, the liquid supply system is situated at a medial portion of the intermediary plate such that no or few problems with loss of liquid through gaps at edges exist. With such a system it is also possible to provide the substrate table with a transmission image sensor (TIS) configured to sense a beam and wherein the intermediary plate is positionable between the sensor and the projection system. Thus it is possible for the transmission image sensor to detect a beam under the same conditions that a substrate is to be imaged. It will therefore be possible to more accurately position the substrate table so that the projection beam is correctly focused on the substrate.

According to an aspect, there is provided a lithographic apparatus comprising:
  a support structure configured to hold a patterning device, the patterning device configured to pattern a beam of radiation according to a desired pattern;
  a projection system configured to project the patterned beam onto a target portion of a substrate;
  a substrate table configured to hold the substrate; and
  a liquid supply system configured to provide a liquid, through which the beam is to be projected, in a space between the projection system and at least one of the substrate and an object positioned on the substrate table, wherein a structure of the liquid supply system extends along at least part of the boundary of the space between the projection system and the substrate table and capillaries extend away from the substrate table and are positioned between the structure and the projection system.

In this way, a larger gap may be spanned over the edge of the substrate or object before catastrophic liquid loss occurs as capillary action aids in the liquid spanning gaps.

In an embodiment, the inner coating of the capillary is hydrophobic and the apparatus comprises an electric device configured to apply a potential difference between the liquid in the space and the capillaries. In this way, an even larger gap may be spanned for liquid loss.

According to an aspect, there is provided a device manufacturing method comprising:
  providing a liquid in a space between a projection system and at least one of a substrate and an object positioned on a substrate table;
  projecting a patterned beam of radiation, through the liquid, onto a target portion of the substrate using the projection system; and
  either: providing an edge seal member surrounding at least part of an edge of the at least one of the substrate and the object and with a primary surface substantially co-planar to a primary surface of the at least one of the substrate and the object, wherein the liquid is provided to a localized area of at least one of the substrate, the object, and the edge seal member, or
  providing an edge seal member at least partly surrounding an edge of the at least one of the substrate and the object and a further edge seal member extending across the gap between the edge seal member and the at least one of the substrate and the object and in contact with the least one of the substrate and the object, or
  providing an edge seal member at least partly surrounding an edge of the least one of the substrate and the object and providing at least one of a vacuum or liquid to the gap between the edge seal member and the least one of the substrate and the object on a side of the least one of the substrate and the object opposite to the projection system, or
  positioning an intermediary plate in the space between the least one of the substrate and the object and the projection system and not in contact with the least one of the substrate and the object, or
  providing a structure extending along at least part of the boundary of the space between the projection system and the substrate table and providing capillaries extending away from the substrate table between the structure and the projection system.

Although specific reference may be made in this text to the use of the apparatus described herein in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm).

BRIEF DESCRIPTION OF THE DRAWINGS

Embodiments of the invention will now be described, by way of example only, with reference to the accompanying schematic drawings in which.

FIG. 8b illustrates a second version of the fourth embodiment;

FIG. 8c illustrates a third version of the fourth embodiment;

In the Figures, corresponding reference symbols indicate corresponding parts.

DETAILED DESCRIPTION

Embodiment 1

Figure 1:
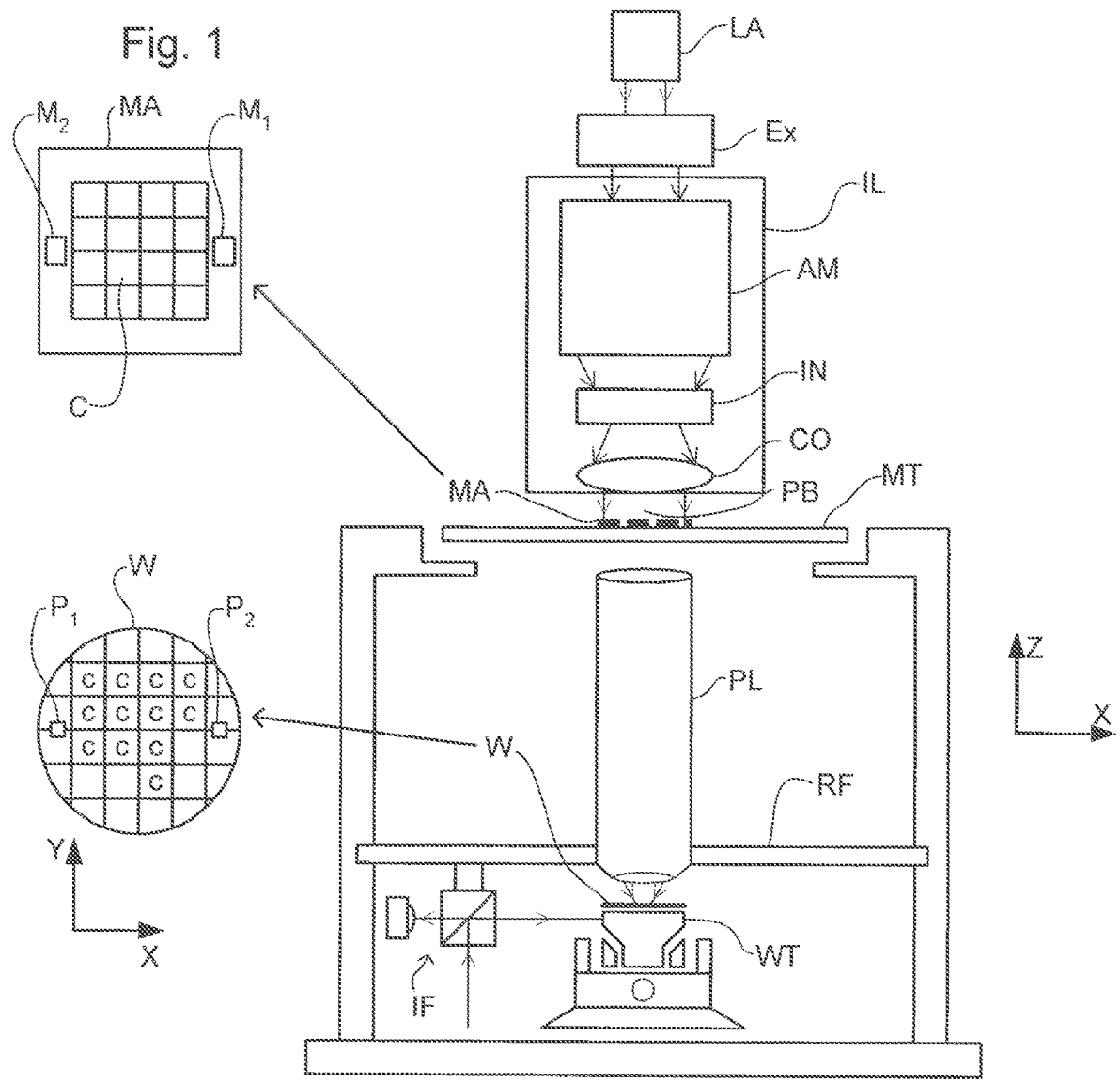
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. DUV radiation), which in this particular case also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning device, such as a programmable mirror array of a type as referred to above.

The source LA (e.g. an excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
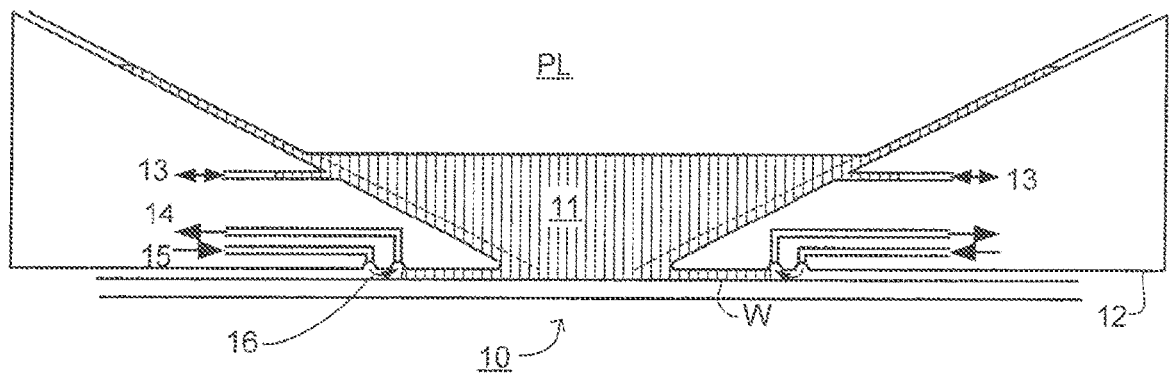
FIG. 2 depicts the liquid reservoir of a first embodiment of the invention.

FIG. 2 shows a liquid reservoir 10 between the projection system PL and the substrate W which is positioned on the substrate stage WT. The liquid reservoir 10 is filled with a liquid 11 having a relatively high refractive index, e.g. water, provided via inlet/outlet ducts 13. The liquid has the effect that the radiation of the projection beam is a shorter wavelength in the liquid than in air or in a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture. Furthermore, at fixed numerical aperture, the liquid is effective to increase the depth of field.

The reservoir 10 forms, in an embodiment, a contactless seal to the substrate W around the image field of the projection system PL so that the liquid is confined to fill the space between the substrate's primary surface, which faces the projection system PL, and the final optical element of the projection system PL. The reservoir is formed by a seal member 12 positioned below and surrounding the final element of the projection system PL. Thus, the liquid supply system provides liquid on only a localized area of the substrate. The seal member 12 forms part of the liquid supply system for filling the space between the final element of the projection system PL and the substrate with a liquid.

This liquid is brought into the space below the projection system PL and within the seal member 12. The seal member 12 in an embodiment extends a little above the bottom element of the projection system PL and the liquid rises above the final element so that a buffer of liquid is provided. The seal member 12 has an inner periphery that at the upper end closely conforms to the shape of the projection system PL or the final element thereof and may, e.g. be round. At the bottom the inner periphery closely conforms to the shape of the image field, e.g. rectangular, though this is not necessarily so. The seal member is substantially stationary in the XY plane relative to the projection system PL though there may be some relative movement in the Z direction (in the direction of the optical axis). A seal is formed between the seal member and the surface of the substrate. This seal is desired to be a contactless seal and may be a gas seal.

The liquid 11 is confined in the reservoir 10 by a seal device 16. As illustrated in FIG. 2, the seal device is a contactless seal i.e. a gas seal. The gas seal is formed by gas, e.g. air or synthetic air, provided under pressure via inlet 15 to the gap between seal member 12 and substrate W and extracted by first outlet 14. The over pressure on the gas inlet 15, vacuum level or under pressure on the first outlet 14 and the geometry of the gap are arranged so that there is a high-velocity gas flow inwards towards the optical axis of the apparatus that confines the liquid 11. As with any seal, some liquid is likely to escape, for example up the first outlet 14.

Figure 22:
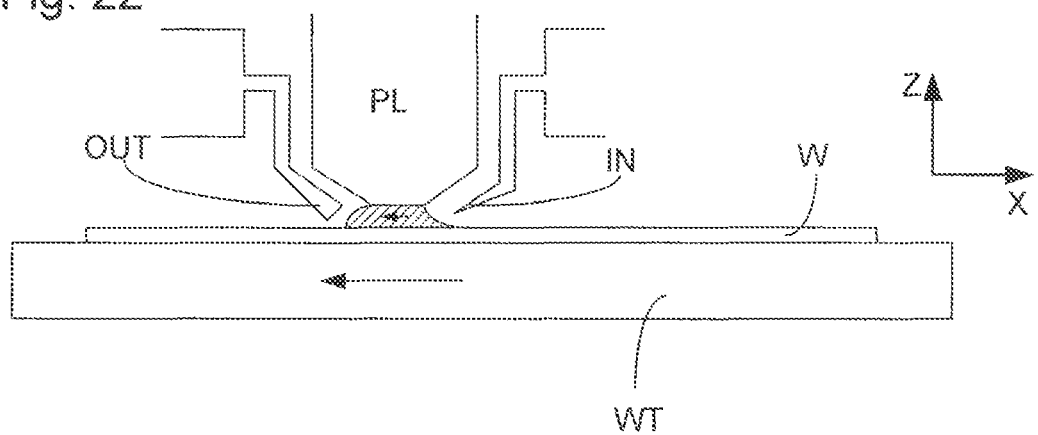
FIG. 22 illustrates an alternative liquid supply system according to an embodiment of the invention.
Figure 23:
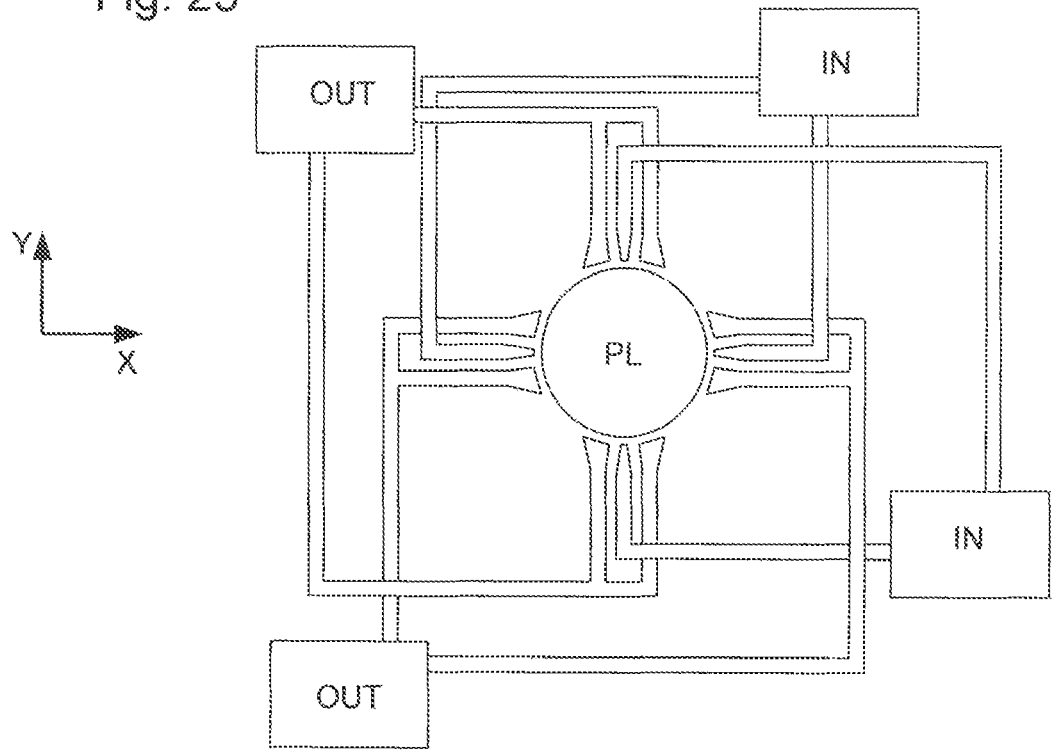
FIG. 23 illustrates, in plan, the system of FIG. 22.

FIGS. 22 and 23 also depict a liquid reservoir defined by inlet(s) IN, outlet(s) OUT, the substrate W and the final element of projection system PL. Like the liquid supply system of FIG. 2 the liquid supply system illustrated in FIGS. 22 and 23, comprising inlet(s) IN and outlet(s) OUT, supplies liquid to the primary surface of the substrate in a localized area between the final element of the projection system and the substrate and can suffer from loss of liquid at the substrate edge.

Thus, as used herein for the embodiments, the liquid supply system can comprise that as described in relation to FIG. 2 and FIGS. 22 and 23.

A problem with the liquid supply arrangement illustrated in FIGS. 2, 22 and 23 occurs when imaging edge portions of the substrate W. This is because when the substrate W edge is positioned underneath the projection system PL one of the constraining walls (the substrate W) of the liquid supply system (the bottom one as illustrated) is removed thereby allowing immersion liquid to escape. However, the embodiments described herein can be used with any other type of liquid supply system.

Figure 3:
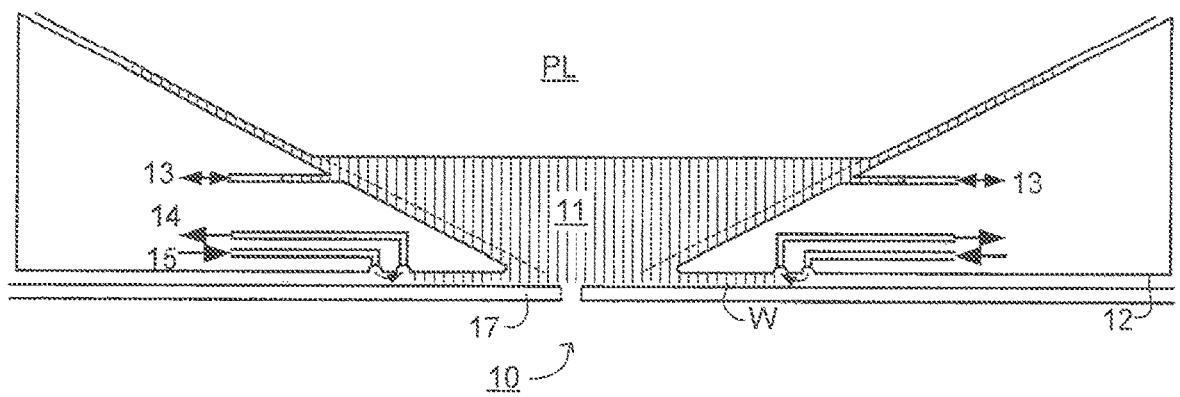
FIG. 3 is similar to FIG. 2 showing an edge seal member on the substrate table according to an embodiment of the invention.

FIG. 3 illustrates how the edge portion of a substrate W may be imaged without catastrophic loss of immersion liquid from the liquid supply system. This is achieved by the provision of a cover plate or edge seal member 17 on the substrate table WT. The edge seal member 17 has an upper (as illustrated) primary surface substantially co-planar with the upper primary surface of substrate W and is closely adjacent to the edge of the substrate W so that there is no sudden loss of liquid as the edge of the substrate moves under the projection system PL. Some liquid loss into the gap may still occur. Of course there are arrangements in which the whole construction illustrated in FIGS. 2 and 3 is positioned upside down so that it is the lower surfaces of the edge seal member and the substrate which face the projection system and which are substantially co-planar. The surfaces are therefore referred to as the primary surfaces which face the projection system PL rather than upper surfaces. References herein to upper surfaces and lower surfaces may be also appropriately considered as references to lower and upper surfaces respectively in an upside-down configuration.

With this system, the liquid supply system (e.g. reservoir 10) can be positioned over the edge of the substrate W and can even be moved completely off the substrate W. This enables edge portions of the substrate W to be imaged.

Figure 4:
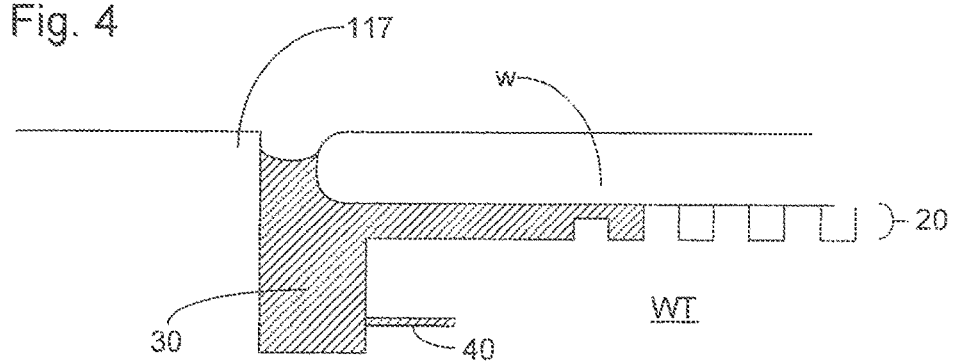
FIG. 4 illustrates a second embodiment of the invention.
Figure 5:
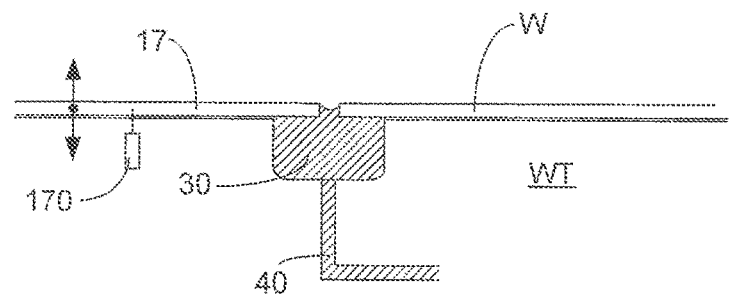
FIG. 5 illustrates an alternative form of the second embodiment of the present invention.
Figure 6:
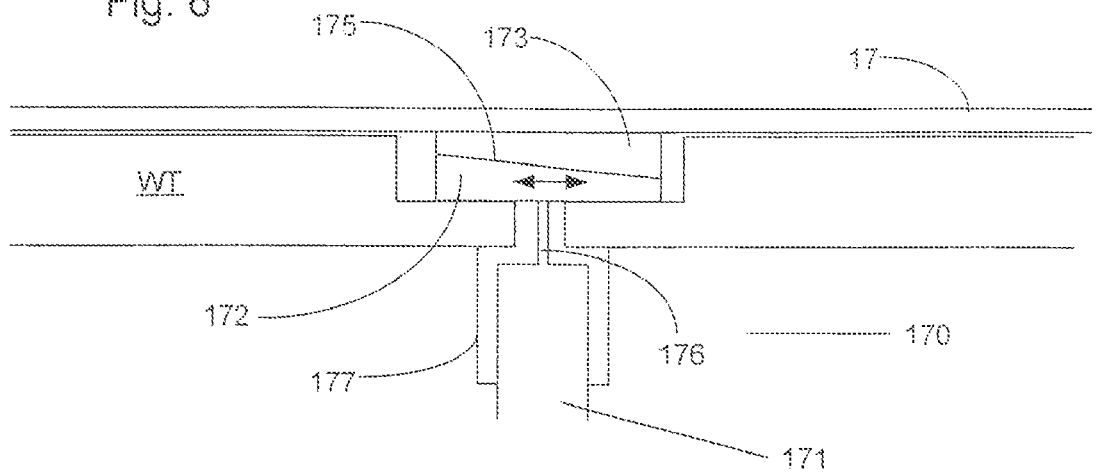
FIG. 6 illustrates a detail of the second embodiment of the present invention.

The edge seal member 17 may form an integral part of the substrate table WT (as illustrated in FIG. 4 as edge seal member 117) or may be temporarily mounted relative to the remainder of the substrate table by the use of, for example, vacuum suction or through use of electromagnetic forces. In an embodiment, the edge seal member 17 is moveable relative to the remainder of the substrate table (as illustrated in FIGS. 5 and 6) such that the height above the substrate table WT of the primary surface of the edge seal member 17 may be adjusted such that it is substantially co-planar with the primary surface of the substrate W. In this way the same edge seal member 17 may be used for different thicknesses of substrate W (thickness tolerance is about 25 µm though the embodiment can account for up to about 0.2 mm variation). The positioning mechanism for the edge seal member 17 may be through use of piezoelectric elements or electromagnetism, worm gear, etc. A suitable mechanism is described in relation to the second embodiment described below.

The edge seal member 17 may be formed of several individual segments, each of which surrounds a portion of the edge of the substrate W.

Embodiment 2

A second embodiment is illustrated in FIGS. 4 to 6 and is the same or similar as the first embodiment except as described below.

In the embodiment of FIGS. 4 and 5 an edge liquid supply system provides liquid to a reservoir 30 via a port 40. The liquid in the reservoir 30 is optionally the same as the immersion liquid in the liquid supply system. The reservoir 30 is positioned on the opposite side of the substrate W to the projection system PL and adjacent the edge of the substrate W and the edge of the edge seal member 17, 117. In FIG. 5, the edge seal member 17 is comprised of an element which is separate to the substrate table WT whereas in FIG. 4 the edge seal member 117 is provided by an integral portion of the substrate table WT. As can be seen most clearly from FIG. 4, the substrate W is supported on the substrate table WT by a so-called pimple table 20. The pimple table 20 comprises a plurality of projections on which the substrate W rests. The substrate W is held in place by, e.g., a vacuum source sucking the substrate onto the top surface of the substrate table WT. With the use of the reservoir 30, when the edge of the substrate W is being imaged, (i.e. when liquid in the liquid supply system between the projection system PL and the substrate W traverses across an edge of the substrate), liquid cannot escape from the liquid supply system into the gap between the edge seal member 17, 117 and the substrate W because that space is already filled with liquid.

The mechanism 170 shown in FIG. 5 for moving the edge seal member 17 relative to the remainder of the substrate table WT is illustrated in detail in FIG. 6. The reason for moving the edge seal member 17 in this way is so that its primary surface can be made to be substantially co-planar with the primary surface of the substrate W. This allows a smooth movement of the liquid supply system over edge portions of the substrate W so that the bottom inner periphery of the liquid supply system can be moved to positions partly on the primary surface of substrate W and partly on the primary surface of the edge seal member 17.

A level sensor (not illustrated) is used to detect the relative heights of the primary surfaces of the substrate W and the edge seal member 17. Based on the results of the level sensor, control signals are sent to the actuator 171 in order to adjust the height of the primary surface of the edge seal member 17. A closed loop actuator could also be used for this purpose.

In an embodiment, the actuator 171 is a rotating motor which rotates a shaft 176. The shaft 176 is connected to a circular disc at the end distal to the motor 171. The shaft 176 is connected away from the centre of the disc. The disc is located in a circular recess in a wedge portion 172. Ball bearings may be used to reduce the amount of friction between the circular disc and the sides of the recess in the wedge portion 172. The motor 171 is held in place by leaf springs 177. On actuation of the motor the wedge portion is driven to the left and right as illustrated (i.e. in the direction of the slope of the wedge portion) because of the excentre position of the shaft 176 in the disc. The motor is prevented from moving in the same direction as the direction of movement of the wedge portion 172 by the springs 177.

As the wedge portion 172 moves left and right as illustrated in FIG. 6, its top surface 175 (which is the surface of the wedge which is sloped in relation to the primary surface of the edge seal member 17) contacts the bottom sloped surface of a further wedge member 173 which is fixed to the bottom of the edge seal member 17. The edge seal member 17 is prevented from moving in the direction of movement of the wedge member 172 so that when the wedge member 172 moves left and right the edge seal member 17 is lowered and raised respectively. Some biasing of the edge seal member 17 towards the substrate table WT may be necessary.

Obviously the further wedge member 173 could be replaced by an alternative shape, for example a rod positioned perpendicularly to the direction of movement of the wedge 172. If the coefficient of friction between the wedge member 172 and the further wedge member 173 is greater than the tangent of the wedge angle then the actuator 170 is self-braking meaning that no force is required on the wedge member 172 to hold it in place. This is advantageous as the system will then be stable when the actuator 171 is not actuated. The accuracy of the mechanism 170 is of the order of a few µm.

Especially in the case of the edge seal member 117 being an integral part of the substrate table WT, a mechanism may be provided to adjust the height of the substrate W or the member supporting the substrate W so that the primary surfaces of the edge seal member 17, 117 and the substrate can be made substantially co-planar.

Embodiment 3

A third embodiment is illustrated in FIG. 7 and is the same or similar as the first embodiment except as described below.

This embodiment is described in relation to an edge seal member 117 which is an integral part of the substrate table WT. However, this embodiment is equally applicable to an edge seal member 17 which is movable relative to the substrate table WT. In this embodiment it is not vital however that the edge seal member 17 has an upper surface co-planar with the primary surface of the substrate, but this is desired. A vacuum port 46 connected to a vacuum source is provided underneath and adjacent edge portions of the edge seal member 117 and the substrate W on the opposite side of the substrate W to the projection system PL. In an embodiment, the port 46 is annular and formed by a continuous groove but may be discontinuous i.e. a discrete number of openings arranged in a circular pattern. In its simplest form the embodiment may work only with that vacuum supply via port 46. However, the basic idea can be improved by the provision of a substrate table WT as illustrated in detail in FIG. 7a which illustrates a first version of the third embodiment.

A portion 48 of the substrate table WT extends from the edge of the edge seal portion 117 radially inwardly so that it is positioned below the substrate table W on the other side of the substrate W to the projection system PL. Any immersion liquid which leaks through the gap between the portion 48 and the substrate W is attracted towards the vacuum source via port 46. A channel 42 is provided radially inwardly of the vacuum source also under the substrate W and is connected to a gas source. This may be a gas at a pressure greater than atmospheric pressure or it may be that the channel 42 is simply open to the atmosphere. This creates a flow of gas radially outwardly below the substrate W between the portion 48 of substrate table WT below the substrate W and the pimple table 20. (The pimple table 20 has its own vacuum source to hold the substrate in place.) With this flow of gas any liquid escaping between edge seal member 117 and the substrate W is pulled towards an annular compartment 44 (roughly 3×3 mm in cross section) in fluid connection with the vacuum source. The compartment 44 is positioned between an annular port 47 open to the gap and the port 46 connected to the vacuum source. The compartment helps in establishing uniform flow around the periphery. The channel 42 is connected to a continuous annular groove (shown as a widening of the duct). The compartment 44, port 47, and/or the groove of channel 42 need not be annular and can be other appropriate shapes or configurations.

In one working embodiment, the gap between the portion 48 of substrate table WT and the substrate W is of the order of up to 100 μm (though the gap may not exist i.e. is zero), which prevents a high flow rate of liquid through the gap due to capillary action. The height of the portion 45 of the substrate table WT between the groove connected to channel 42 and compartment 44 is such that the distance between the bottom of the substrate W and the top of that portion 45 (indicated as distance D1 in FIG. 7a) is typically of the order of 100 μm and is chosen such that a uniform gas flow of in the region of at least 1 m/s is achievable with a pressure loss of less than 0.5 bar. Such an arrangement ensures that only very little, if any, liquid passes through the gap D1 and interferes with the pimple table 20. Other values will also work.

Figure 7A:
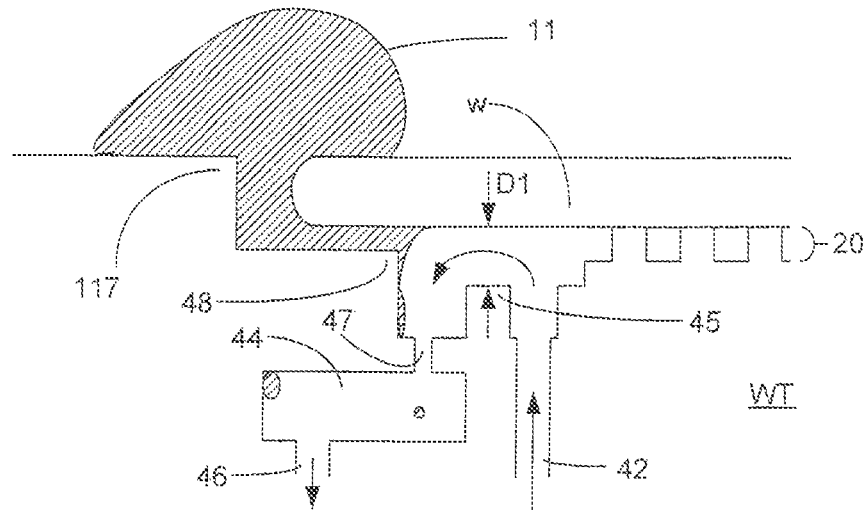
FIGS. 7a-d illustrate four versions of a third embodiment of the present invention.

A first version of the third embodiment illustrated in FIG. 7a may suffer from deflection of the outer 10 mm or so of the substrate W. As can be seen from FIG. 7a this area is unsupported even though, as said above, portion 45 can be extended to underneath the substrate W where it supports the substrate W. However, at the very outer radius both the weight of the substrate W and the capillary force of liquid between the substrate W and portion 48 of the substrate table WT can still deflect the edge of the substrate W. This may be deleterious. Solutions to this problem are illustrated in FIGS. 7b-d which illustrate second through fourth versions of the third embodiment.

Figure 7B:
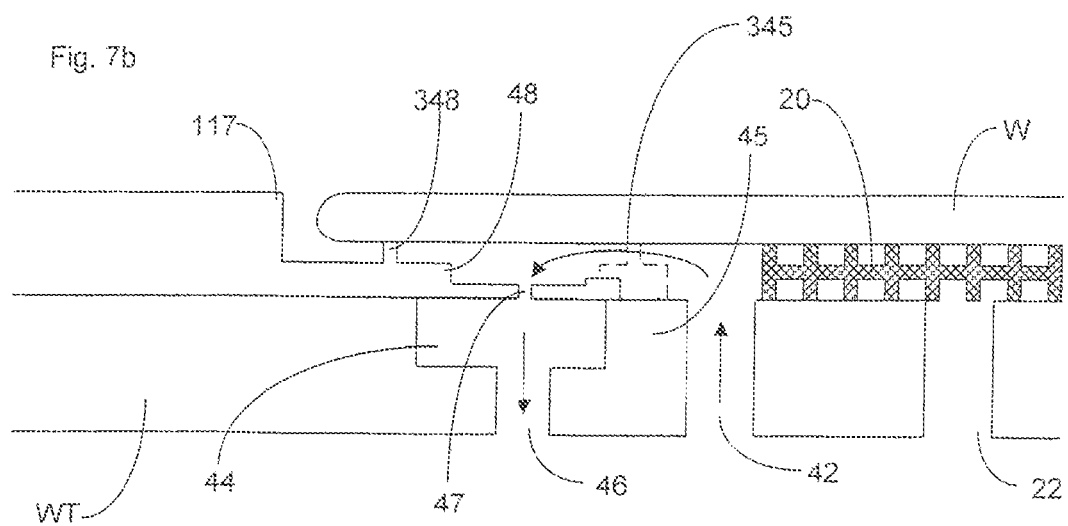
Figure 7C:
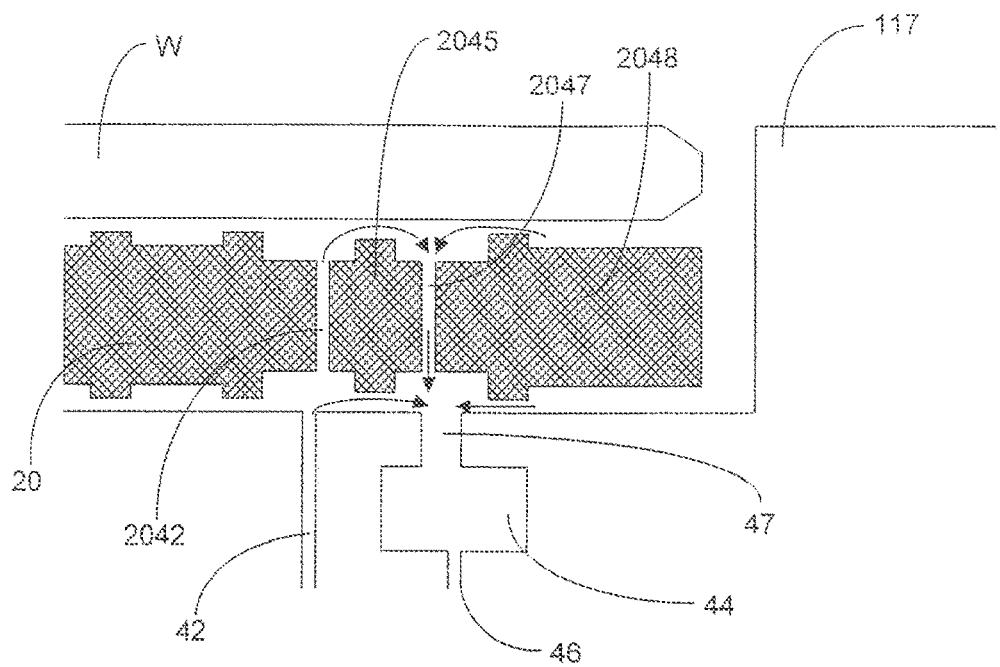
Figure 7D:
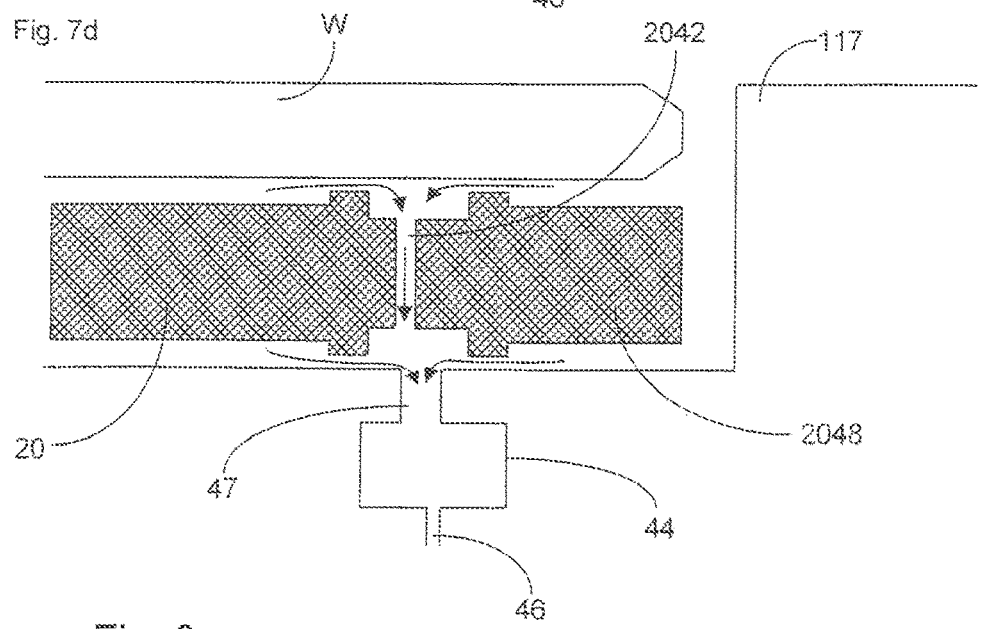

In the second version illustrated in FIG. 7b, the portion 48 has at least one set of burls 348 positioned around and near to the edge of the periphery of the substrate W (typically in a circular pattern). As the burls 348 are discrete, immersion liquid can still seep between the portion 48 and the substrate W but the weight of the substrate W is supported by the at least one set of burls 348. In an embodiment, the burls 348 have a smaller height than the burls of the pimple table 20 which compensates for the difference in the force downwards on the substrate W caused by the vacuum 22 of the pimple table 20 compared to the force on the substrate W at the edge in the vicinity of burls 348. The calculation must take the stiffness of the burls into account and if the burls are manufactured from a low expansion material such as Zerodur, they should be about 80 nm less high than the burls of the pimple table 20. The gap between the portion 48 and the bottom of the substrate W is in an embodiment about 20 μm.

In the version of FIG. 7b, portion 45 is similar in shape to that of the first version. However, an alternative has a ring or circular pattern of burls 345 positioned above portion 45. The discrete nature of the burls 345 allows gas from channel 42 to be sucked into the compartment 44. These burls 345 are also about 80 nm less high than the burls of the pimple table 20. In an embodiment, gap D1 in between the burls 345 is about 50 μm. The burls 345 may be formed by the pimple table 20 and need not necessarily be part of the substrate table WT.

From the above two versions of the third embodiment it will be clear that the architecture of the gas seal formed by passages 42 and 47 can be formed either completely by the substrate table WT, completely by the pimple table 20 or by a combination of both. FIGS. 7c and 7d illustrate two further versions of the third embodiment. FIG. 7c illustrates a third version of the third embodiment in which the gas seal is formed by members of the pimple table 20. The portion 45 of the first and second versions is formed by a (annular) portion of the pimple table 2045 and portion 48 of the first and second versions is formed by (annular) portion 2048 of the pimple table 20. Passages 2042, 2047 equivalent to 42 and 47 are formed between the portions 20, 2045 and 2048. However, only a part of the gas flow passes through the two passages 2042, 2047; as illustrated, some gas flows under the pimple table 20 which is effective to block further ingression of immersion liquid which seeps under the outer edge of the pimple table 20. This arrangement has an advantage that all of the accurate dimensions are made in the pimple table 20 and the substrate table WT does not contain any complex grooves.

In a fourth version of the third embodiment illustrated in FIG. 7d, no inlet channel 42 is provided and gas flows from the pimple table 20 into (annular) port 47. This version has an advantage that a more stable pressure is experienced between the substrate W and the pimple table 20 because the pimple table 20 does not need its own vacuum source. Furthermore, extra passage 2047 which is provided in the third version is no longer necessary and only passage 2042 is used. Thus, a single vacuum source is effective both to clear away leaking immersion fluid as well as holding the substrate in place. A gas source may be required under the pimple table 20 (perhaps the more usual vacuum port in the substrate table under the pimple table can be used for this purpose) so that a flow of gas outwards can be established.

It will be clear that various features of each of the versions of the third embodiment can be combined so long as a flow of gas radially outwardly from the centre of the pimple table towards the vacuum 46 is achieved.

Embodiment 4

Figure 8A:
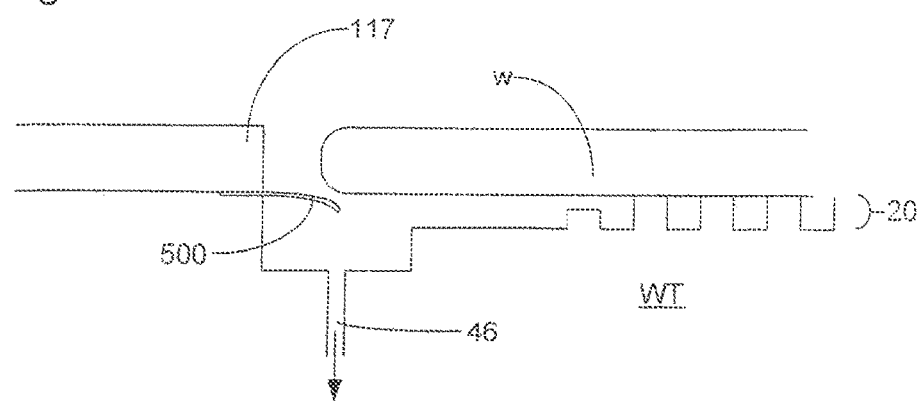
FIG. 8a illustrates a first version of a fourth embodiment of the present invention.
Figure 9:
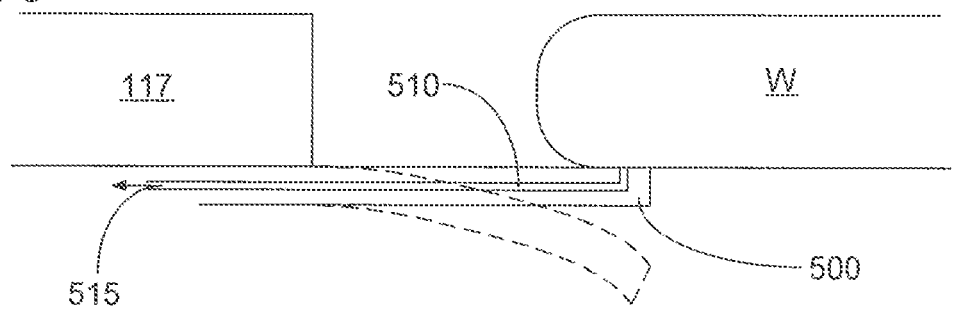
FIG. 9 illustrates in detail further aspects of the first version of the fourth embodiment of the present invention.

A fourth embodiment is illustrated in FIGS. 8 and 9 and is the same or similar as the first embodiment except as described below.

This embodiment is described in relation to an edge seal member 117 which is an integral part of the substrate table WT. However, this embodiment is equally applicable to an edge seal member 17 which is movable relative to the substrate table WT.

In a first version of this embodiment as illustrated in FIG. 8a, a further edge seal member 500 is used to bridge the gap between the edge seal member 117 and the substrate W. The further edge seal member is affixed to the edge seal member 117. The further edge seal member 500 is removably attachable against the surface of the substrate W opposite the primary surface. In this embodiment the further edge seal member 500 can be a flexible edge seal member which is actuatable to contact the under surface of the substrate W. When the flexible edge seal member 500 is deactivated it falls away from the substrate under gravity. The way this may be achieved is illustrated in FIG. 9 and is described below.

It is likely that the further edge seal member 500 will not prevent all of the immersion liquid from the liquid supply system from entering the space under the substrate W and for this reason a port 46 connected to a low pressure source may be provided under the substrate W adjacent edges of the edge seal member 117 and the substrate W in some or all of the versions of this embodiment. Of course the design of the area under the substrate could be the same as that of the third embodiment.

The same system can be used for sensors such as a transmission image sensor (TIS) on the substrate table as opposed for the substrate W. In the case of sensors, as the sensors do not move, the edge seal member 500 can be permanently attached to the sensor, for example using glue.

Furthermore, the edge seal member 500 can be arranged to engage with the top surface of the object (that surface closest to the projection system PL) rather than the bottom surface. Also, the further edge seal member 500 may be provided attached to or near the top surface of the edge seal member 117 as opposed to under the edge seal member 117 as is illustrated in FIG. 8a.

A second version of this embodiment is illustrated in FIG. 8b. Two further edge seal members 500a, 500b are used. The first of these edge seal members 500a is the same as in the first version. The second of these edge seal members 500b is affixed to the substrate table 20 i.e. underneath the substrate W and extends with its free end radially outwardly from its attachment point. The second further edge seal member 500b clamps the first further edge seal member 500a against the substrate W. Compressed gas can be used to deform or move the second further edge seal member 500b.

A third version of this embodiment is shown in FIG. 8c. The third version is the same as the second version except the first further edge seal member 500c clamps the second further edge seal member 500d to the substrate W. This avoids, for example, the need for the compressed gas of the second version.

It will be appreciated that the embodiment will also work with only the second further edge seal member 500b, 500d with or without connection to vacuum.

Various ways of deforming the further edge seal members 500, 500a, 500b, 500c, 500d will now be described in relation to the first version of the embodiment.

As can be seen from FIG. 9, a channel 510 is formed in the elongate direction of a flexible further edge seal member 500 (which in an embodiment is an annular ring) and (a) discrete port(s) are provided in an upper surface of the flexible further edge seal member which faces the projection system PL and the underside of the substrate W. By connecting a vacuum source 515 to the duct 510 the flexible further edge seal member can be made to abut the substrate W by suction. When the vacuum source 515 is disconnected or switched off, the flexible further edge seal member 500 drops under gravity and/or pressure from port 46 to assume the position shown in dotted lines in FIG. 9.

In an alternative embodiment a flexible further edge seal member 500 is formed with a mechanical pre-load such that it contacts the substrate W when the substrate is placed on the pimple table 20 and the flexible further edge seal member 500 deforms elastically so that it applies a force upwards on the substrate W to thereby make a seal.

In a further alternative, a flexible further edge seal member 500 may be forced against the substrate W by an overpressure generated by pressurized gas on port 46.

A flexible further edge seal member 500 may be fashioned from any flexible, radiation and immersion liquid resistant, non-contaminating material, for example, steel, glass e.g. $Al_2O_3$, ceramic material e.g. SiC, silicon, Teflon, low expansion glasses (e.g. Zerodur™ or ULE™), carbon fibre epoxy or quartz and is typically between 10 and 500 μm thick, in an embodiment between 30 and 200 μm or 50 to 150 μm in the case of glass. With a flexible further edge seal member 500 of this material and these dimensions, the typical pressure to be applied to the duct 510 is approximately 0.1 to 0.6 bar.

Embodiment 5

Figure 10:
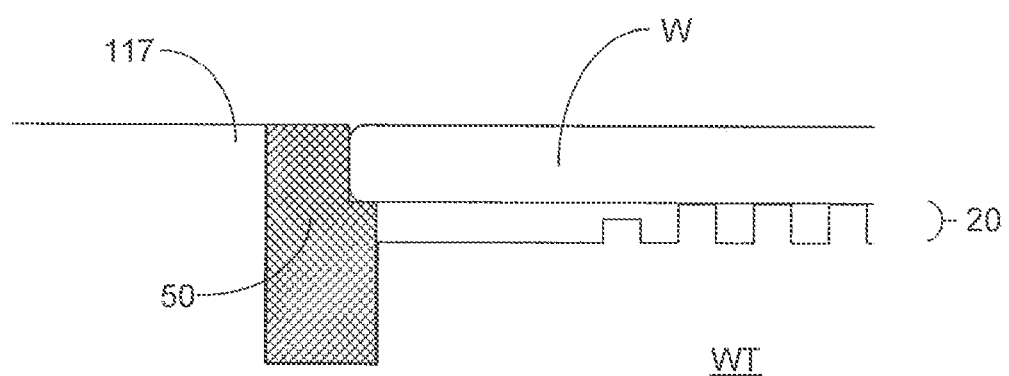
FIG. 10 illustrates a fifth embodiment of the present invention.

A fifth embodiment is illustrated in FIG. 10 and is the same or similar as the first embodiment except as described below.

This embodiment is described in relation to an edge seal member 117 which is an integral part of the substrate table WT. However, this embodiment is equally applicable to an edge seal member 17 which is movable relative to the substrate table WT.

In the fifth embodiment, the gap between the edge seal member 117 and the substrate W is filled with a further edge seal member 50. The further edge seal member is a flexible further edge seal member 50 which has a top surface which is substantially co-planar with the primary surfaces of the substrate W and the edge seal member 117. The flexible further edge seal member 50 is made of a compliant material so that minor variations in the diameter/width of substrate W and in the thickness of the substrate W can be accommodated by deflections of the flexible further edge seal member 50. When liquid in the liquid supply system under the projection system PL passes over the edge of the substrate, the liquid cannot escape between the substrate W, flexible further edge seal member 50 and edge seal member 117 because the edges of those elements are tight against one another. Furthermore, because the primary surfaces of the substrate W and the edge seal member 117 and the top surface of the flexible further edge seal member 50 are substantially co-planar, the liquid supply system operation is not upset when it passes over the edge of the substrate W so that disturbance forces are not generated in the liquid supply system.

As can be seen from FIG. 10, the flexible further edge seal member 50 is in contact with a surface of the substrate W opposite the primary surface of the substrate W, at an edge portion. This contact has two functions. First the fluid seal between the flexible further edge seal member 50 and the substrate W may be improved. Second, the flexible further edge seal member 50 applies a force on the substrate W in a direction away from the pimple table 20. When the substrate W is held on the substrate table WT by, e.g. vacuum suction, the substrate can be held securely on the substrate table. However, when the vacuum source is switched off or disconnected, the force produced by the flexible further edge seal member 50 on the substrate W is effective to push the substrate W off the substrate table WT thereby aiding loading and unloading of substrates W.

The flexible further edge seal member 50 is made of a radiation and immersion liquid resistant material such as PTFE.

Embodiment 6

Figure 11:
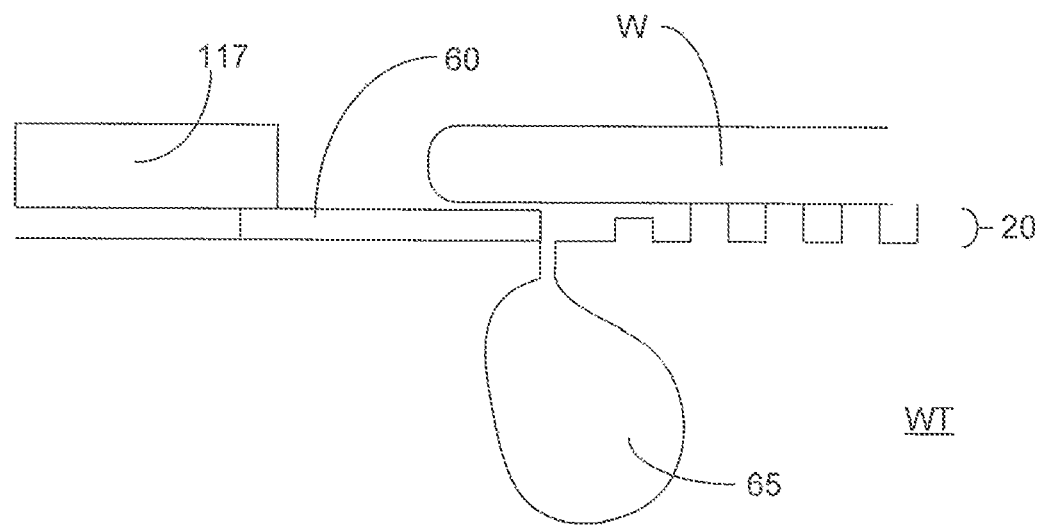
FIG. 11 illustrates a sixth embodiment of the present invention.

FIG. 11 illustrates a sixth embodiment which is the same or similar as the first embodiment except as described below.

This embodiment is described in relation to an edge seal member 117 which is an integral part of the substrate table WT. However, this embodiment is equally applicable to an edge seal member 17 which is movable relative to the substrate table WT.

The sixth embodiment illustrates how the pimple table 20 can be decoupled from the liquid supply system between the substrate W and the edge seal member 117. This is done by positioning an opening exposed to the atmosphere 65 between the edge of the substrate W and the vacuum holding the substrate W on the substrate table WT and associated with the pimple table 20.

A layer 60, positioned on the opposite side of the substrate W to the projection system PL and under the substrate at its edge leaving a gap between the substrate W and the layer 60 of about 10 µm, comprises any material which is hydrophobic such as Teflon™, silicon rubber, or other plastics material. Inorganic materials are desired because they have better radiation resistance. In this way, liquid which finds its way into the gap between the substrate W and the edge seal member 117 when the liquid supply system is positioned over the edge of the substrate W is repelled such that an effective seal is formed and liquid does not find its way to the pimple table 20. In an embodiment, the immersion liquid has a contact angle of at least 90° with the hydrophobic layer 60.

Embodiment 7

A seventh embodiment will be described with reference to FIGS. 12 to 15. The seventh embodiment is the same or similar as the first embodiment except as described below.

Figure 12:
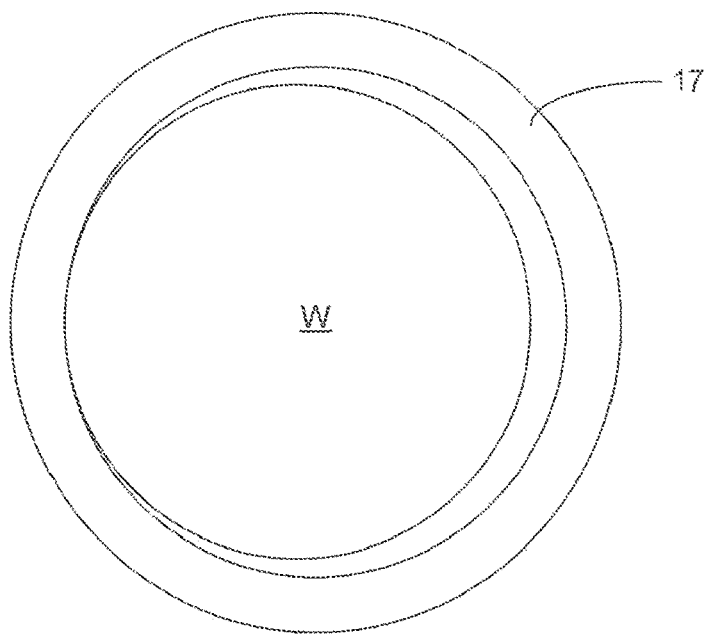
FIG. 12 illustrates in plan the substrate and edge seal member of a seventh embodiment of the present invention.

In the seventh embodiment, as is illustrated in FIG. 12, the edge seal member 17 is annular with a central hole larger than the diameter of the circular substrate W. The shapes of the substrate W and edge seal member 17 may be different than annular so long as the central hole of the edge seal member 17 is larger than the outer diameter/width of the substrate W. In this way, the edge seal member 17 may accommodate variations in the substrate W diameter/width.

Figure 13:
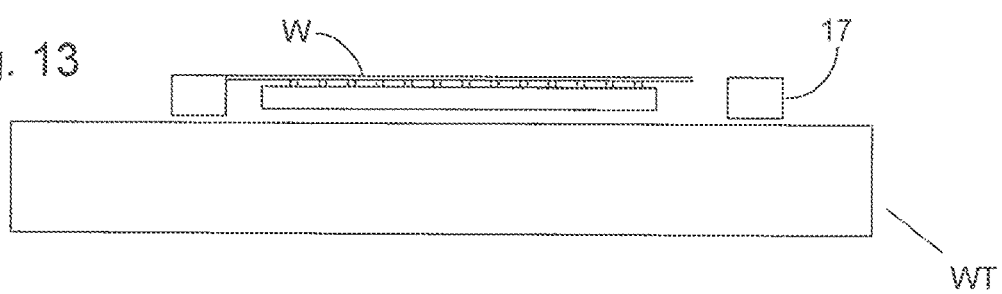
FIG. 13 illustrates a cross section through the seventh embodiment of the present invention.

The edge seal member 17 is movable on the substrate table WT such that when the liquid supply system moves towards an edge portion of the substrate W in order to expose it, the edge seal member 17 can be moved closely to abut that edge portion of the substrate W which is to be exposed. This is best illustrated in FIG. 13 where the left hand side of the substrate W is about to be exposed.

Figure 14:
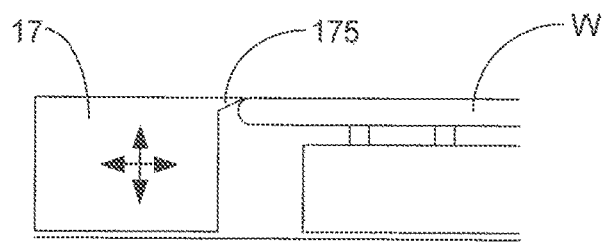
FIG. 14 illustrates a detail of the seventh embodiment of the present invention.

As is clearly illustrated in FIG. 14, the edge seal member 17 is movable both in the plane of the primary surface of the substrate W and in an embodiment also in the Z direction (i.e. in the direction of the optical axis of the apparatus). In this way, the edge seal member 17 can be moved to the edge of the substrate W when required and can have the height of its top (primary) surface adjusted so that its primary surface is closely co-planar with the primary surface of the substrate W. This allows the liquid supply system to effectively contain the immersion liquid in its reservoir even when the edge of the substrate W is being imaged.

Also illustrated in FIG. 14 is a projection 175 which has a top surface which is co-planar with the primary surface of the edge seal member 17, i.e. the primary surface of the edge seal member 17 overhangs on an edge adjacent the substrate W so that the projection extends towards the optical axis of the apparatus. As can be seen from FIG. 14, this allows the gap between the primary surfaces of the substrate W and edge seal member 17 to be minimized even when the edge of the substrate W is slightly curved (i.e. the edge of the substrate W is not perpendicular to the primary surface).

Figure 15:
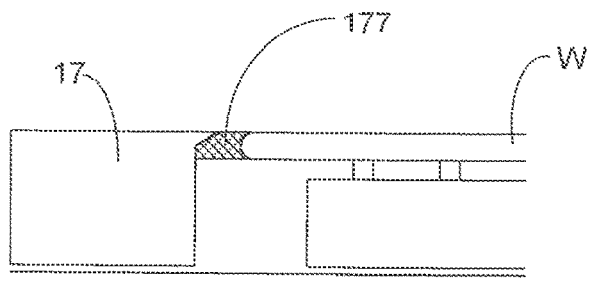
FIG. 15 illustrates in detail a further arrangement of the seventh embodiment.

Another way of improving or reducing the gap between the edge seal member 17 and the substrate W is to provide a further (flexible) edge seal member 177 between the edge of the edge seal member 17 closest to the substrate W and the substrate W. This is illustrated in FIG. 15. This may be done with or without a projection 175. A further flexible edge seal member 177 can deform around the edge of the substrate W so as to form a tight seal with the substrate W. The further flexible edge seal member 177 is attached to the edge seal member 17. The further flexible edge seal member 177 has an upper surface which is substantially co-planar with the primary surfaces of the substrate W and the edge seal member 17.

Embodiment 8

Figure 16:
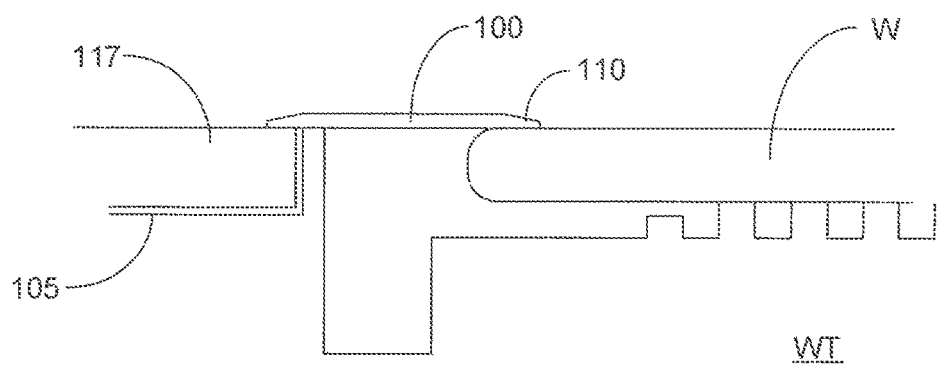
FIG. 16 illustrates an eighth embodiment of the present invention.

FIG. 16 illustrates an eighth embodiment which is the same or similar as the first embodiment except as described below.

This embodiment is described in relation to an edge seal member 117 which is an integral part of the substrate table WT. However, this embodiment is equally applicable to an edge seal member 17 which is movable relative to the substrate table WT.

As can be seen from FIG. 16, the eighth embodiment includes a further edge seal member 100 for bridging the gap between the edge seal member 117 and the substrate W. In this case the further edge seal member 100 is a gap seal member which is positioned on the primary surfaces of the substrate W and the edge seal member 117 to span the gap between the substrate W and edge seal member 117. Thus, if the substrate W is circular, the gap seal member 100 will also be circular (annular).

The gap seal member 100 may be held in place by the application of a vacuum 105 to its underside (that is a vacuum source exposed through a vacuum port on the primary surface of the edge seal member 117). The liquid supply system can pass over the edge of the substrate W without the loss of liquid because the gap between the substrate W and the edge seal member 117 is covered over by the gap seal member 100. The gap seal member 100 can be put in place and removed by the substrate handler so that standard substrates and substrate handling can be used. Alternatively, the gap seal member 100 can be kept at the projection system PL and put in place and removed by appropriate mechanisms (e.g. a substrate handling robot). The gap seal member 100 should be stiff enough to avoid deformation by the vacuum source. Advantageously the gap seal member 100 is less than 50, in an embodiment 30 or 20 or even 10 μm thick to avoid contact with the liquid supply system, but should be made as thin as possible.

The gap seal member 100 is advantageously provided with tapered edges 110 in which the thickness of the gap seal member 100 decreases towards the edges. This gradual transition to the full thickness of the gap seal member ensures that disturbance of the liquid supply system is reduced when it passes on top of the gap seal member 100.

The same way of sealing may be used for other objects such as sensors, for example transmission image sensors. In this case, as the object is not required to move, the gap seal member 100 can be glued in place (at either end) with a glue which does not dissolve in the immersion liquid. The glue can alternatively be positioned at the junction of the edge seal member 117, the object and the gap seal member 100.

Furthermore, the gap seal member 100 can be positioned underneath the object and an overhang of the edge seal member 117. The object may be shaped with an overhang also, if necessary.

The gap seal member 100, whether above or below the object, can have a passage provided through it, from one opening in a surface in contact with the edge seal member 117 to another opening in a surface in contact with the object. By positioning one opening in fluid communication with vacuum 105, the gap seal member 100 can then be kept tightly in place.

Embodiment 9

Figure 17:
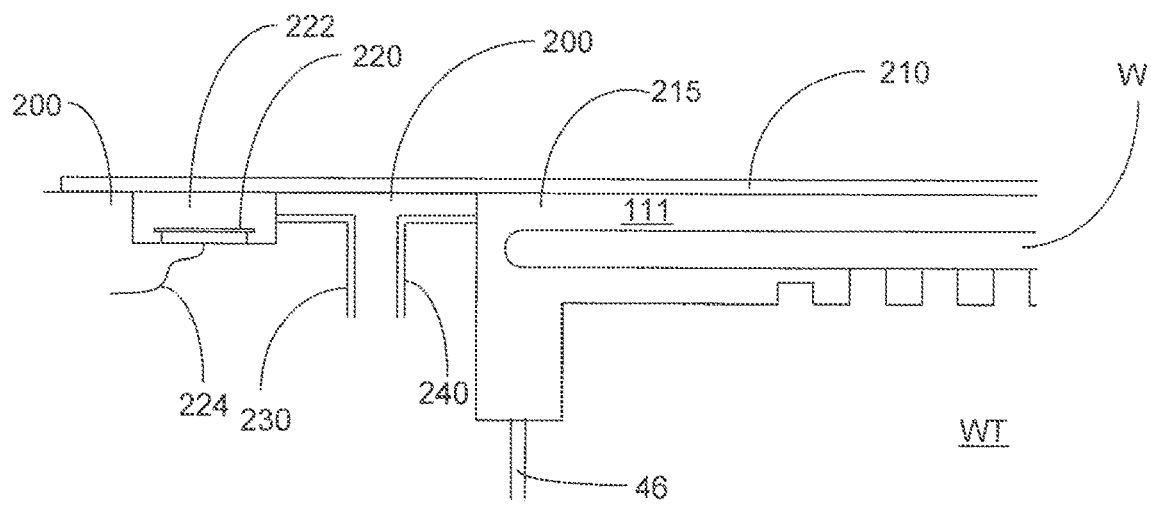
FIG. 17 illustrates a ninth embodiment of the present invention.

A ninth embodiment will be described with reference to FIG. 17. The solution shown in FIG. 17 bypasses some of the problems associated with imaging edge portions of the substrate W as well as allows a transmission image sensor (TIS) 220 (or other sensor) to be illuminated by the projection system PL under the same conditions as the substrate W.

The ninth embodiment uses the liquid supply system described with respect to the first embodiment. However, rather than confining the immersion liquid in the liquid supply system under the projection system PL on its lower side with the substrate W, the liquid is confined by an intermediary plate 210 which is positioned between the liquid supply system and the substrate W. The spaces 222, 215 between the intermediary plate 210 and the TIS 220 and the substrate W are also filled with liquid 111. This may either be done by two separate space liquid supply systems via respective ports 230, 240 as illustrated or by the same space liquid supply system via ports 230, 240. Thus the space 215 between the substrate W and the intermediary plate 210 and the space 222 between the transmission image sensor 220 and the intermediary plate 210 are both filled with liquid and both the substrate W and the transmission image sensor can be illuminated under the same conditions. Portions 200 provide a support surface or surfaces for the intermediary plate 210 which may be held in place by vacuum sources.

The intermediary plate 210 is made of such a size that it covers all of the substrate W as well as the transmission image sensor 220. Therefore, no edges need to be traversed by the liquid supply system even when the edge of the substrate W is imaged or when the transmission image sensor is positioned under the projection system PL. The top surface of the transmission image sensor 220 and the substrate W are substantially co-planar.

The intermediate plate 210 can be removable. It can, for example, be put in place and removed by a substrate handling robot or other appropriate mechanism.

Embodiment 10

Figure 18:
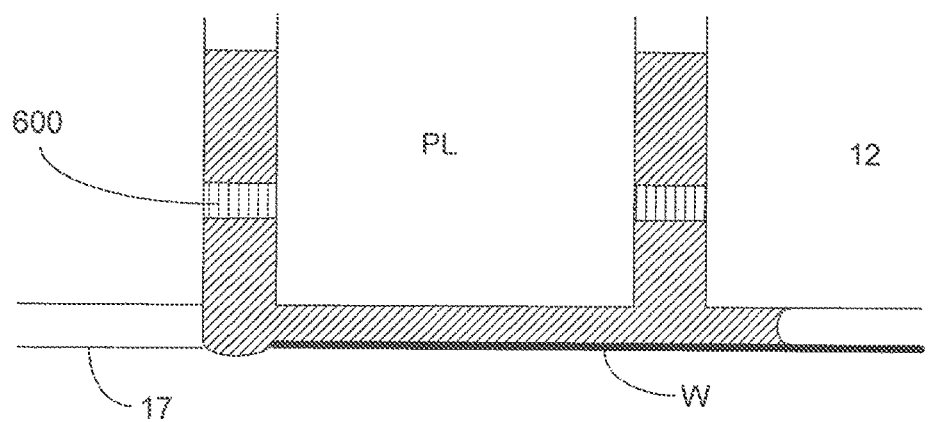
FIG. 18 illustrates a tenth embodiment of the present invention.

FIG. 18 shows a modification of the liquid supply system which is applicable to any other embodiment described herein which is effective to increase the size of gap the immersion liquid can span before sudden liquid loss.

A plurality of capillaries 600 are provided between the liquid supply system (e.g. seal member 12) and the projection system PL. These capillaries extend generally upwardly, i.e. away from the substrate W. If the capillaries have a radius r, the liquid film thickness h, which can be supported by the capillary, is given by the formula:

$$h = 2\sigma \cos \theta / rg\rho$$

where $\sigma$ is the interfacial tension, $\theta$ the contact angle between the liquid and the capillaries W and $\rho$ the liquid density. Thus by making $\cos \theta$ positive (i.e. making the inner surface of the capillaries hydrophobic, for example by a coating) the capillaries can support a portion of liquid with height h above the gap so that a larger gap can be spanned.

By applying a voltage between the hydrophobic coated capillaries and the liquid, $\cos \theta$ can be reduced to around zero and this allows free flow of liquid through the capillaries 600 (according to equation 1 above) so that liquid can be removed from the liquid supply system under the projection system PL in little time by keeping the length of the capillaries low. This is advantageous for keeping the liquid clean. When the edge of the substrate W is imaged, the voltage can be removed so that the gap can be spanned. In order to lift the liquid film from the substrate W, it is proposed to coat the substrate W edges with a hydrophobic material (or the resist on the substrate W edges can be removed as the substrate material itself is hydrophobic).

The capillaries 600 may be provided by substantially straight ducts with a substantially circular cross-section or by other shaped ducts. For example, the capillaries may be made up of voids in a porous material.

Embodiment 11

Figure 19:
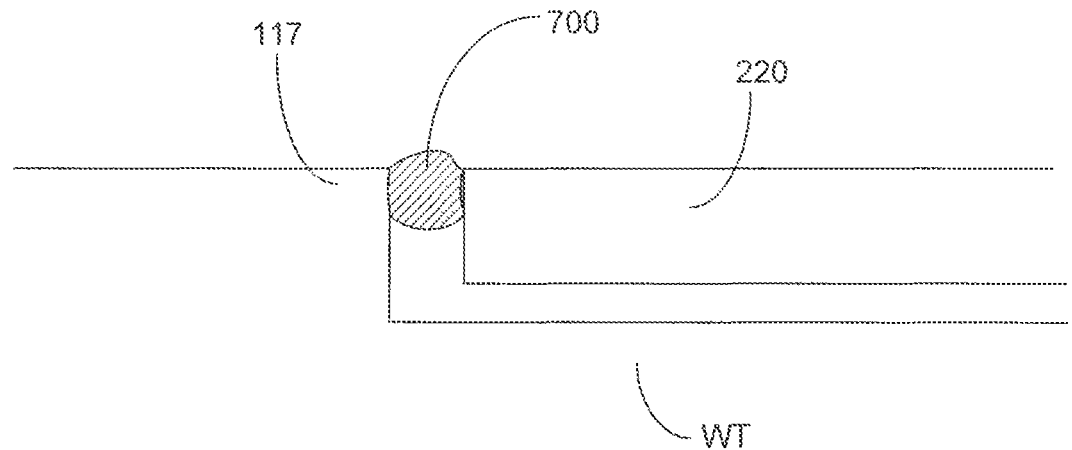
FIG. 19 illustrates an eleventh embodiment of the present invention.

FIG. 19 shows an eleventh embodiment which is the same as the first embodiment except as described below.

In the eleventh embodiment the object on the substrate table WT is a sensor 220 such as a transmission image sensor (TIS). In order to prevent immersion liquid seeping underneath the sensor 220, a bead of glue 700 which is undissolvable and unreactable with the immersion fluid is positioned between the edge seal member 117 and the sensor 220. The glue is covered by immersion fluid in use.

Embodiment 12

A twelfth embodiment is described with reference to FIGS. 20 and 21. In the twelfth embodiment it is a sensor 220 which is being sealed to the substrate table WT. In both versions illustrated in FIGS. 20 and 21, a vacuum 46 is provided adjacent the gap with an opening passage 47 and a chamber 44 for taking away any immersion liquid which should find its way through the gap between the edge seal member 117 and the edge of the sensor 220.

Figure 20:
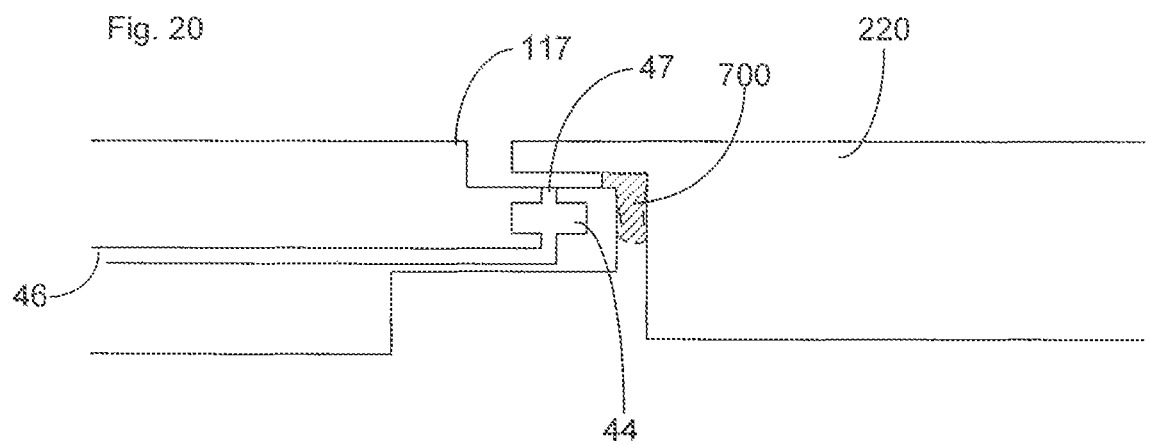
FIG. 20 illustrates a twelfth embodiment of the present invention.

In the FIG. 20 version, the vacuum 46 is provided in the substrate table WT under an overhang portion of the object 220. The passage 47 is provided in an overhanging inwardly protruding portion of the substrate table WT. Optionally a bead of glue 700 is positioned at the inner most edge of the protruding portion between the substrate table WT and the object 220. If no bead of glue 700 is provided, a flow of gas from underneath the object 220 helps seal the gap between the sensor 220 and the substrate table WT.

Figure 21:
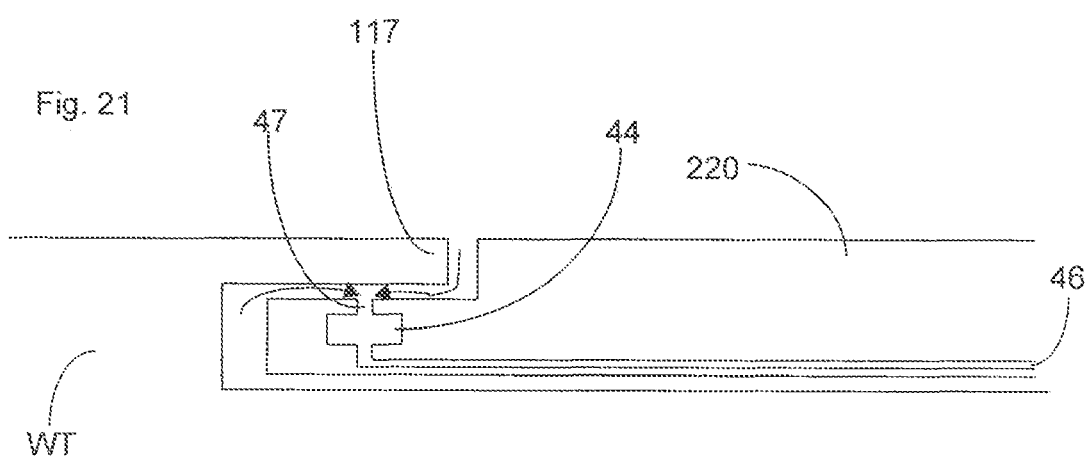
FIG. 21 illustrates a thirteenth embodiment of the present invention.

In the version of FIG. 21, the vacuum 46, compartment 44 and passage 47 are provided in the object 220 itself under an inwardly protruding edge seal member 117. Again there is the option of providing a bead of glue between the object 220 and the substrate table WT radially outwardly of the passage 47.

All of the above described embodiments may be used to seal around the edge of the substrate W. Other objects on the substrate table WT may also need to be sealed in a similar way, such as sensors including sensors and/or marks which are illuminated with the projection beam through the liquid such as a transmission image sensor, an integrated lens interferometer and scanner (wavefront sensor) and spot sensor plates. Such objects may also include sensors and/or marks which are illuminated with non-projection radiation beams such as levelling and alignment sensors and/or marks. The liquid supply system may supply liquid to cover all of the object in such a case. Any of the above embodiments may be used for this purpose. In some instances, the object will not need to be removed from the substrate table WT as, in contrast to the substrate W, the sensors do not need to be removed from the substrate table WT. In such a case the above embodiments may be modified as appropriate (e.g. the seals may not need to be moveable).

Each of the embodiments may be combined with one or more of the other embodiments as appropriate. Further, each of the embodiments (and any appropriate combination of embodiments) can be applied simply to the liquid supply system of FIG. 2 and FIGS. 19 and 20 without the edge seal member 17, 117 as feasible and/or appropriate.

The shape of the edge seal member 117 and the top outer most edge of the sensor 220 can be varied. For example, it may be advantageous to provide an overhanging edge seal member 117 or indeed an outer edge of the sensor 220 which is overhanging. Alternatively, an outer upper corner of the sensor 220 may be useful.

While specific embodiments of the invention have been described above, it will be appreciated that the invention may be practiced otherwise than as described. In particular, the invention is also applicable to other types of liquid supply systems, especially localized liquid area systems. If the seal member solution is used, it may be one in which a seal other than a gas seal is used. The description is not intended to limit the invention.

FIELD

The present invention relates to immersion lithography.

BACKGROUND

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such a patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791, incorporated herein by reference.

It has been proposed to immerse the substrate in the lithographic projection apparatus in a liquid having a relatively high refractive index, e.g. water so as to fill a space between the final element of the projection system and the substrate. The point of this is to enable imaging of smaller features as the exposure radiation will have a shorter wavelength in the liquid. (The effect of the liquid may also be regarded as increasing the effective NA of the system and also increasing the depth of focus.)

However, submersing the substrate or substrate and substrate table in a bath of liquid (see for example U.S. Pat. No. 4,509,852, hereby incorporated in its entirety by reference) may mean that there is a large body of liquid that must be accelerated during a scanning exposure. This may require additional or more powerful motors and turbulence in the liquid may lead to undesirable and unpredictable effects.

Figure 32:
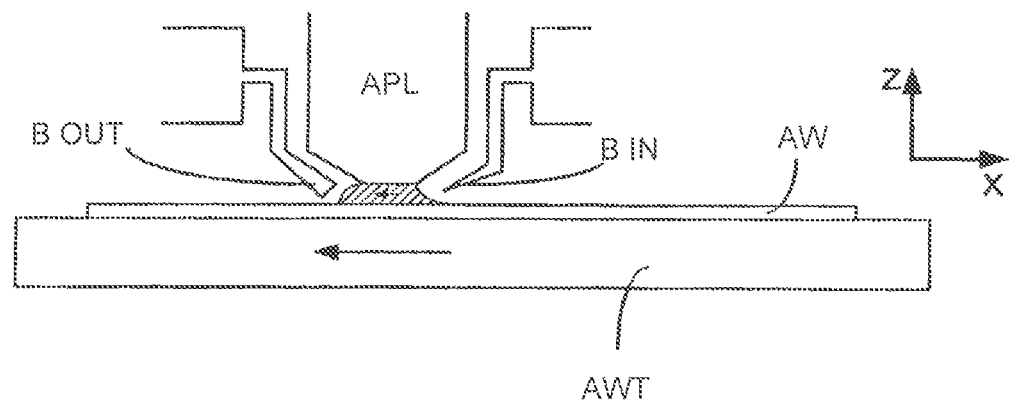
FIG. 32 illustrates an alternative liquid supply system according to an embodiment of the invention.
Figure 33:
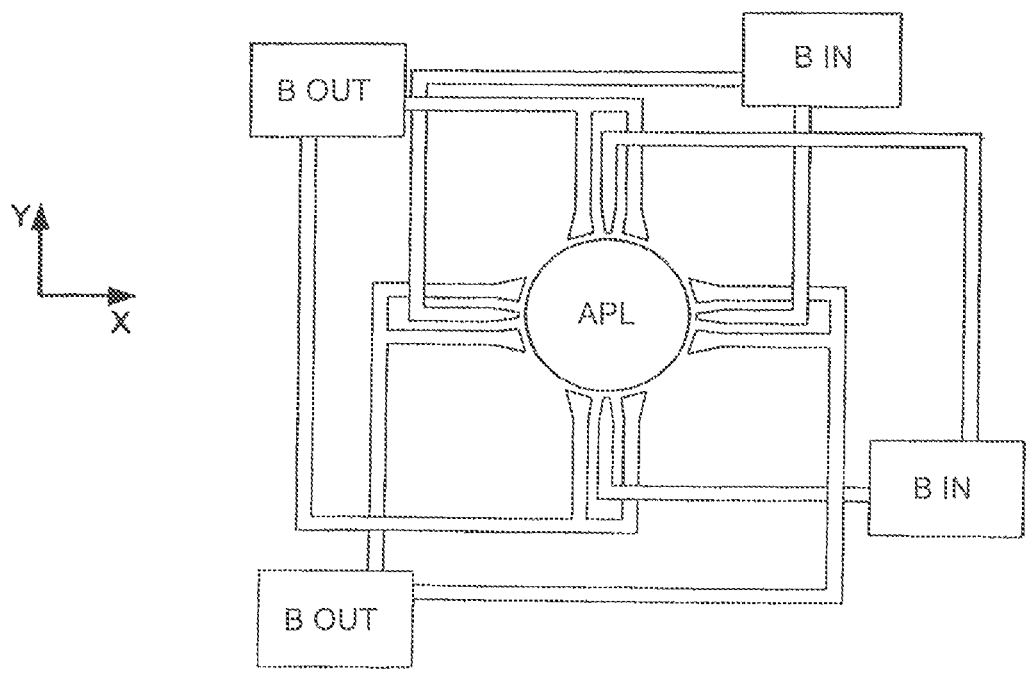
FIG. 33 illustrates, in plan, the system of FIG. 32.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 32 and 33, liquid is supplied by at least one inlet BIN onto the substrate, preferably along the direction of movement of the substrate relative to the final element, and is removed by at least one outlet BOUT after having passed under the projection system. That is, as the substrate is scanned beneath the element in a −X direction, liquid is supplied at the +X side of the element and taken up at the −X side. FIG. 32 shows the arrangement schematically in which liquid is supplied via inlet BIN and is taken up on the other side of the element by outlet BOUT which is connected to a low pressure source. In the illustration of FIG. 32 the liquid is supplied along the direction of movement of the substrate relative to the final element, though this does not need to be the case. Various orientations and numbers of in- and out-lets positioned around the final element are possible, one example is illustrated in FIG. 33 in which four sets of an inlet with an outlet on either side are provided in a regular pattern around the final element.

SUMMARY

With such and other arrangements for providing liquid on only a localized area of the substrate, the substrate itself acts to contain the liquid of the liquid supply system in a space between the final element of the projection system and the substrate. If the substrate is removed (for example, during substrate exchange) and no other measures are taken, the liquid will run out of the liquid supply system. Clearly this is a situation which is to be avoided. The liquid can be removed from the space before the substrate is moved. However, as the residue of liquid which is inevitably left behind when the liquid supply system is emptied of liquid, dries, drying spots may be left behind on elements of the projection system which were immersed in the liquid during exposure. This may be clearly detrimental to the continuing high performance of the projection system. Also, on refilling the space with liquid, it may be hard to avoid the formation of bubbles. Filling of the space with liquid will also take time and may reduce throughput time.

Accordingly, it may be advantageous to provide, for example, a lithographic projection apparatus in which immersion lithography can be performed and in which removing liquid from the liquid supply system during substrate exchange can be avoided or reduced.

According to an aspect, there is provided a lithographic projection apparatus comprising:

a support structure configured to hold a patterning device, the patterning device configured to pattern a beam of radiation according to a desired pattern;

a substrate table configured to hold a substrate;

a projection system configured to project the patterned beam onto a target portion of the substrate;

a liquid supply system configured to provide an immersion liquid, through which the beam is to be projected, in a space between the projection system and the substrate; and a shutter configured to keep the projection system in contact with liquid when the substrate is moved away from under the projection system.

In this way drying marks on the projection system can be avoided. This solution is ideal for a localized area liquid supply system which provides immersion liquid to only a localized area of the substrate. One arrangement could involve one or more jets to project liquid onto the projection system during substrate swap.

In an embodiment, there is provided a shutter positionable on a side of the liquid supply system opposite the projection system such that liquid can be confined in the liquid supply system and between the projection system and the shutter. With this arrangement, for example, the shutter can be moved under the liquid supply system after exposure of the substrate in order to contain the immersion liquid. The substrate may then be moved from the substrate table without substantially losing liquid from the liquid supply system, because the shutter takes the place of the substrate and is of a size equal to or greater than the localized area so that liquid can't substantially escape between the projection system and the shutter.

In an embodiment, the shutter comprises a surface of the substrate table. With this arrangement, the substrate table is moved after exposure to a position at which the substrate may be removed but also to a position at which the shutter is positioned over the liquid supply system. A seal, such as a gas seal, which can also be used to seal a liquid confinement structure that extends along at least a part of the boundary of the space to contain liquid and that forms an aperture for the patterned beam to pass through to the substrate during exposure, can remain activated to seal between the liquid supply system and the shutter. The shutter blocks the aperture. Alternatively, the shutter may be raised relative to the structure to abut the structure and the seal can then be de-activated.

In an embodiment, the shutter is separable from the remainder of the apparatus. It is also movable relative to the remainder of the apparatus. That is, the shutter is relatively small, perhaps shaped like a plate, and not permanently attached to other parts of the apparatus. In this embodiment, the substrate table can be moved completely away from the liquid supply system after exposure as the shutter is positioned over the liquid supply system and is independent of the substrate table. In this embodiment the shutter can be carried by the substrate table during exposure and to this end the shutter and/or the substrate table has or have a holding device configured to releasably hold the shutter to the substrate table. Also, an attachment device may be provided to releasably attach the shutter to the liquid supply system. The attachment device or the holding device may comprise a magnet to generate the force required to attach or hold. Alternatively, those devices may comprise a vacuum outlet configured to attract the shutter to the substrate table and/or the liquid supply system. In the case of the attachment device, use may be made of a gas seal configured to seal between the liquid supply system and the substrate during exposure in order to provide the force to attach the shutter to the liquid supply system.

In an embodiment, the liquid supply system comprises an outlet configured to remove liquid from the space and a gas inlet configured to provide flushing gas in the space. Flushing might be required every now and again due to contamination of the liquid or perhaps during a long term shut down of the apparatus. In this way, liquid may be removed from the space and the space can be flushed with gas. The shutter is then attached to the aperture to protect the projection system.

In an embodiment, the liquid supply system is configured to provide the liquid to a space between a final lens of the projection system and the substrate.

According to an aspect, there is provided a device manufacturing method comprising:

providing an immersion liquid to a space between a projection system and a substrate;

projecting a patterned beam of radiation, through the liquid, onto a target portion of the substrate using the projection system; and maintaining the projection system in contact with liquid after the substrate has been moved away from under the projection system.

Although specific reference may be made in this text to the use of the apparatus described herein in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm).

Embodiment 14

Figure 24:
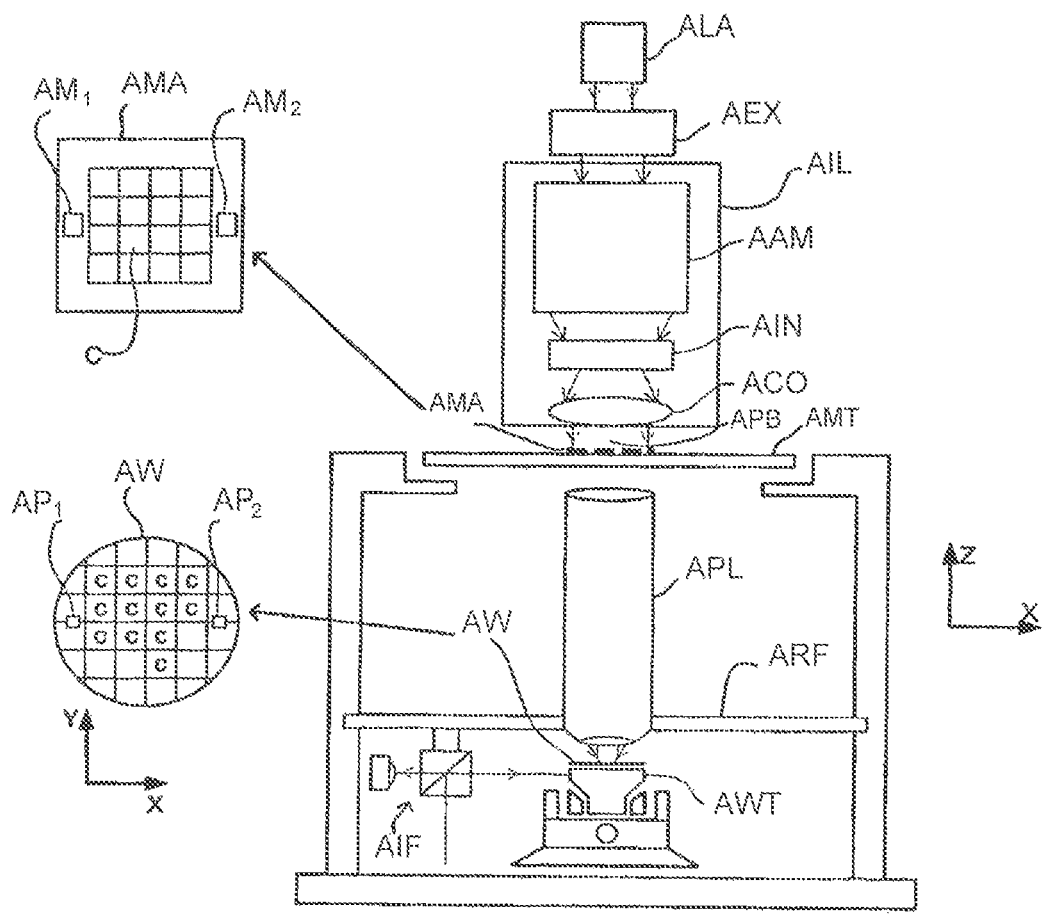
FIG. 24 depicts a lithographic projection apparatus according to an embodiment of the invention.

FIG. 24 schematically depicts a lithographic projection apparatus according to a particular embodiment of the invention. The apparatus comprises:

a radiation system AEx, AIL, for supplying a projection beam APB of radiation (e.g. UV radiation), which in this particular case also comprises a radiation source ALA;

a first object table (mask table) AMT provided with a mask holder for holding a mask AMA (e.g. a reticle), and connected to first positioning means for accurately positioning the mask with respect to item APL;

a second object table (substrate table) AWT provided with a substrate holder for holding a substrate AW (e.g. a resist-coated silicon wafer), and connected to second positioning means for accurately positioning the substrate with respect to item APL;

a projection system ("lens") APL (e.g. a refractive lens system) for imaging an irradiated portion of the mask AMA onto a target portion C (e.g. comprising one or more dies) of the substrate AW.

As here depicted, the apparatus is of a transmissive (e.g. has a transmissive mask). However, in general, it may also be of a reflective type, for example (e.g. with a reflective mask). Alternatively, the apparatus may employ another kind of patterning device, such as a programmable mirror array of a type as referred to above.

The source ALA (e.g. an excimer laser) produces a beam of radiation. This beam is fed into an illumination system (illuminator) AIL, either directly or after having traversed conditioning means, such as a beam expander AEx, for example. The illuminator AIL may comprise adjusting means AAM for setting the outer and/or inner radial extent (commonly referred to as σ-outer and σ-inner, respectively) of the intensity distribution in the beam. In addition, it will generally comprise various other components, such as an integrator AIN and a condenser ACO. In this way, the beam APB impinging on the mask AMA has a desired uniformity and intensity distribution in its cross-section.

It should be noted with regard to FIG. 24 that the source ALA may be within the housing of the lithographic projection apparatus (as is often the case when the source ALA is a mercury lamp, for example), but that it may also be remote from the lithographic projection apparatus, the radiation beam which it produces being led into the apparatus (e.g. with the aid of suitable directing mirrors); this latter scenario is often the case when the source ALA is an excimer laser. The current invention and claims encompass both of these scenarios.

The beam APB subsequently intercepts the mask AMA, which is held on a mask table AMT. Having been selectively reflected by the mask AMA, the beam APB passes through the lens APL, which focuses the beam APB onto a target portion C of the substrate AW. With the aid of the second positioning means (and interferometric measuring means AIF), the substrate table AWT can be moved accurately, e.g. so as to position different target portions C in the path of the beam APB. Similarly, the first positioning means can be used to accurately position the mask AMA with respect to the path of the beam APB, e.g. after mechanical retrieval of the mask AMA from a mask library, or during a scan. In general, movement of the object tables AMT, AWT will be realized with the aid of a long-stroke module (coarse positioning) and a short-stroke module (fine positioning), which are not explicitly depicted in FIG. 24. However, in the case of a wafer stepper (as opposed to a step-and-scan apparatus) the mask table AMT may just be connected to a short stroke actuator, or may be fixed.

The depicted apparatus can be used in two different modes:

1. In step mode, the mask table AMT is kept essentially stationary, and an entire mask image is projected at one time (i.e. a single "flash") onto a target portion C. The substrate table AWT is then shifted in the x and/or y directions so that a different target portion C can be irradiated by the beam APB;

2. In scan mode, essentially the same scenario applies, except that a given target portion C is not exposed in a single "flash". Instead, the mask table AMT is movable in a given direction (the so-called "scan direction", e.g. the y direction) with a speed v, so that the projection beam APB is caused to scan over a mask image; concurrently, the substrate table AWT is simultaneously moved in the same or opposite direction at a speed V=Mv, in which M is the magnification of the lens APL (typically, M=¼ or ⅕). In this manner, a relatively large target portion C can be exposed, without having to compromise on resolution.

Figure 25:
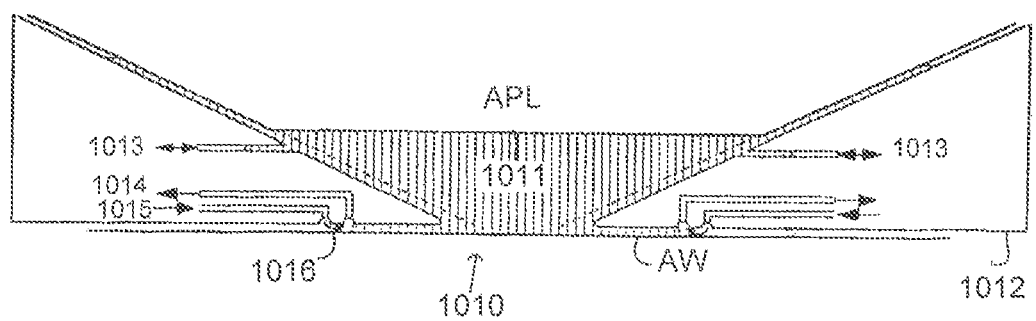
FIG. 25 depicts the liquid reservoir of a fourteenth embodiment of the invention.

FIG. 25 shows a liquid reservoir 1010 between the projection system APL and the substrate AW which is positioned on the substrate stage AWT. The liquid reservoir 1010 is filled with a liquid 1011 having a relatively high refractive index, e.g. water, provided via inlet/outlet ducts 1013. The liquid has the effect that the radiation of the projection beam is a shorter wavelength in the liquid than in air or in a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture. Furthermore, at fixed numerical aperture, the liquid is effective to increase the depth of focus.

The reservoir 1010 forms, in an embodiment, a contactless seal to the substrate AW around the image field of the projection lens APL so that the liquid is confined to fill the space between the substrate's primary surface, which faces the projection system APL, and the final optical element of the projection system APL. The reservoir is formed by a seal member 1012 positioned below and surrounding the final element of the projection lens APL. Thus, the liquid supply system provides liquid on only a localized area of the substrate. The seal member 1012 forms part of the liquid supply system for filling the space between the final element of the projection system and the substrate AW with a liquid. This liquid is brought into the space below the projection lens and within the seal member 1012. The seal member 1012 extends a little above the bottom element of the projection lens and the liquid rises above the final element so that a buffer of liquid is provided. The seal member 1012 has an inner periphery that at the upper end closely conforms to the shape of the projection system or the final elements thereof and may, e.g. be round. At the bottom the inner periphery forms an aperture which closely conforms to the shape of the image field, e.g. rectangular, though this is not necessarily so. The projection beam passes through this aperture.

The liquid 1011 is confined in the reservoir 1010 by a seal 1016. As illustrated in FIG. 25, the seal is a contactless seal, i.e. a gas seal. The gas seal is formed by gas, e.g. air or synthetic air, provided under pressure via inlet 1015 to the gap between seal member 1012 and substrate AW and extracted by first outlet 1014. The over pressure on the gas inlet 1015, vacuum level on the first outlet 1014 and the geometry of the gap are arranged so that there is a high-velocity gas flow inwards towards the optical axis of the apparatus that confines the liquid 1011. As with any seal, some liquid is likely to escape, for example up the first outlet 1014.

FIGS. 32 and 33 also depict a liquid reservoir defined by inlet(s) BIN, outlet(s) BOUT, the substrate AW and the final element of projection lens APL. Like the liquid supply system of FIG. 25 the liquid supply system illustrated in FIGS. 32 and 33, comprising inlet(s) BIN and outlet(s) BOUT, supplies liquid to a space between the final element of the projection system and a localized area of the primary surface of the substrate.

As can be seen from FIGS. 25 and 32, during exposure, the substrate AW provides the bottom wall of the liquid reservoir thereby containing the liquid in a space between the projection system APL and the substrate AW.

Figure 26:
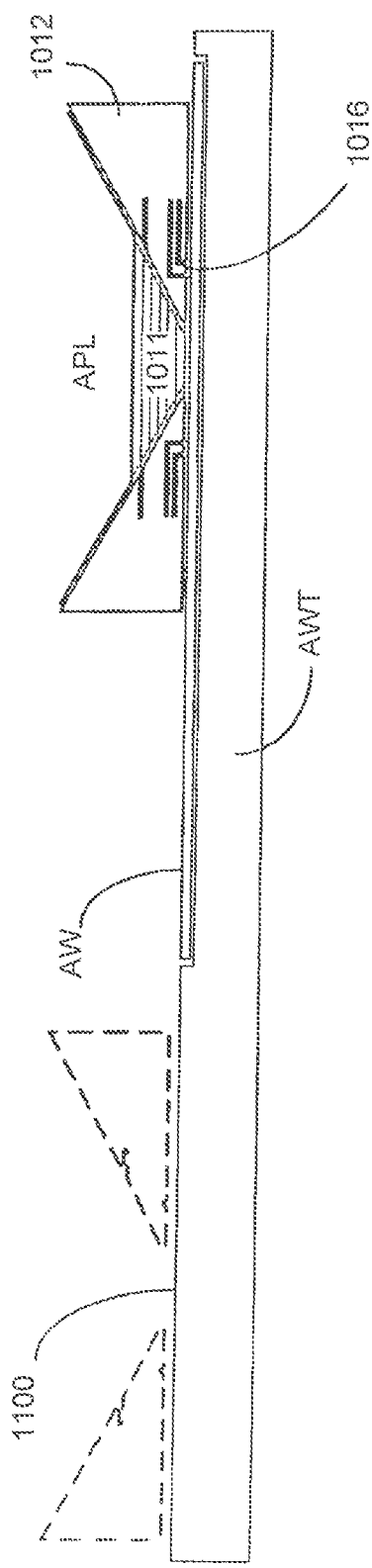
FIG. 26 depicts the liquid reservoir and substrate table of the fourteenth embodiment of the invention.

FIG. 26 shows the substrate table AWT according to a fourteenth embodiment which can be used to avoid the necessity of emptying liquid from the liquid reservoir once the substrate AW has been imaged and before being unloaded from the substrate table AWT. A shutter member 1100 (also termed a cover plate, edge seal member, gap seal means or member or intermediary plate) is provided for this purpose. The shutter member 1100 is a surface other than a substrate surface, in this case an upper (as illustrated) primary surface of the substrate table AWT which is substantially co-planar with the upper primary surface of the substrate AW and is closely adjacent to the edge of the substrate AW. The area of the shutter member 1100 is large enough so that if the substrate table AWT is moved such that the projection system APL and seal member 1012 are positioned over the shutter member 1100 (as illustrated in dotted lines) the shutter member blocks the entire aperture of the seal member 1012 to prevent liquid escaping through the aperture. In this position, the substrate AW can be removed from the substrate table AWT using usual substrate handling equipment. If the edge of the substrate AW is close to the edge of the shutter member 1100 (i.e. the gap between the substrate AW, when positioned on the pimple table or chuck or whatever holds the substrate AW to the substrate table AWT, and the edge of the shutter member 1100 is relatively small), there will be no sudden loss of liquid as the edge of the substrate moves under the aperture in the seal member 1012. The substrate table AWT may be raised towards the projection system to block the aperture so that the seal 1016 can be deactivated.

Embodiment 15

Figure 27:
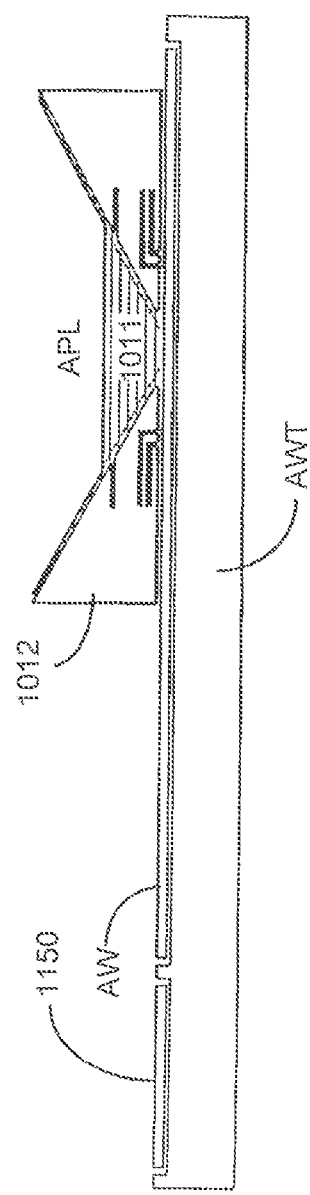
FIG. 27 depicts the liquid reservoir, substrate table and shutter member of a fifteenth embodiment of the invention.

A fifteenth embodiment is illustrated in FIG. 27 and allows the substrate table AWT to be moved completely away from the projection system APL and seal member 1012 in order for the substrate AW to be removed from the substrate table AWT and a new substrate to be placed on the substrate table AWT. Thus it can be used, for example, with dual stage machines.

In the fifteenth embodiment, a shutter member 1150 is in the form of a plate with a primary cross-sectional area larger than that of the localized area or aperture in the seal member 1012. The shape of the shutter member 1150 may be any shape so long as it covers the aperture. The shutter member 1150 is not a substrate and is movable relative to both the substrate table AWT and the seal member 1012 and may be attached to the seal member 1012 by any means, two examples of which are described below.

After imaging of the substrate AW, the substrate table AWT is moved so that the shutter member 1150 is positioned under the aperture of the seal member 1012. The gap between the substrate AW and the top surface of the substrate table AWT and the gap between the top of the substrate table AWT and the top surface of the shutter member 1150 are small so there is no catastrophic loss of liquid from the reservoir 1010 while passing over the gaps. The top (primary) surfaces (as illustrated) of the substrate AW, substrate table AWT between the substrate AW and the shutter member 1150 and the shutter member 1150 are arranged to be substantially co-planar. Once positioned under the projection system APL, the shutter member 1150 is attached to the bottom of the seal member 1012 to cover the aperture. The seal member 1012 is then moved away from the substrate table AWT in the Z direction (the direction of the optical axis) or the substrate table AWT is lowered away from the seal member 1012. The substrate table AWT may then be moved out of the way to a place where the substrate AW may be exchanged. Once a new substrate has been loaded onto the substrate table AWT and any necessary alignment or other measurements (e.g. leveling) have been made (e.g. in a dual stage machine), the substrate table AWT is moved to a position where the shutter member 1150 may be re-positioned onto the substrate table AWT and then the substrate table AWT is moved such that the substrate AW is positioned under the projection system APL so that exposure can begin.

Of course it may be possible to provide the shutter member 1150 on an object in the lithographic apparatus other than the substrate table AWT. For example, a robotic arm can be provided which moves to position the shutter member under the projection system after exposure.

The position of the shutter member 1150 may drift over time so that means for centering or at least keeping a track of the position of the shutter member is useful. This may be a mechanical or optical or electrical or other type of sensor on the landing area of the shutter member on the substrate table AWT and/or such a sensor provided on the liquid supply system (e.g. seal member 1012). For such a system, a quartz shutter member is desired, especially for an apparatus which exposes at 193 nm. Alternatively or additionally, a through lens sensor and detector that uses a reflected signal from a marker on the shutter member 1150 which signal is coupled via a beam splitter to the detector is provided. Such a system can be used while the substrate stage AWT is moving, thereby improving throughput. Alternatively or additionally, the position of the shutter member may be measured by an optical sensor on the substrate table AWT. In this case a mark is applied to the underside or top side of the shutter member 1150 (e.g. a transmissive pattern for the radiation wavelength) and the position of the shutter member 1150 may then be measured by a sensor on the substrate table AWT while the projection system APL exposes the mark. The mark is transmissive to radiation from the projection system (or another radiation source) and a transmission image sensor (TIS) or spot-sensor which is on the substrate table AWT can then be used to measure displacement of the shutter member when attached to the liquid supply system. Depending on the mark design on the shutter member, the transmission image sensor (TIS) or spot sensor that is already available in the substrate table AWT can be used. In this way, the apparatus can keep a record of the drift in position of the shutter member over time by sensing the position regularly, for example every cycle or perhaps only every ten or one hundred cycles or when is deemed necessary. Any necessary adjustments can then be made.

Alternatively, a quad cell sensor can be mounted at the center of the shutter member 1150. An absorbing (or transmissive) spot is positioned in the center of the mirror block so that when the shutter member 1150 is positioned on the substrate stage AWT after use, its position can be measured. The quad cell sensor is made up of four light sensitive cells in a square. When the light beam is on center the outputs of the four cells are equal. If the sensor drifts to one side, the outputs of the cells on that side increase compared to the cells or the other side. Thus any deviation from the desired position can be corrected the next time the shutter member 1150 is attached to the liquid supply system.

Another way of centering the shutter member 1150, which does not involve complicated positional sensing, is to provide the shutter member 1150 with a shape which is self centering when picked up by the liquid supply system. A suitable example might be a thicker shutter member 1150 than is needed with a conical edge that locates in the aperture of the liquid supply system.

Figure 28:
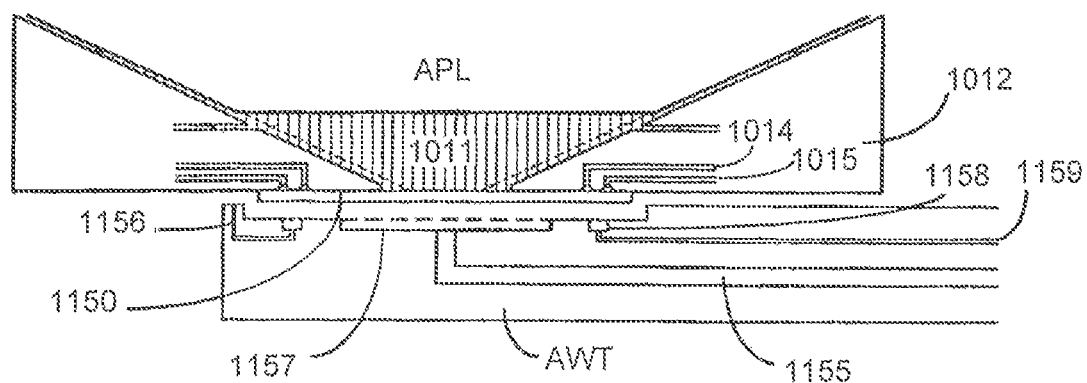
FIG. 28 depicts the liquid reservoir, substrate table and shutter member of the fifteenth embodiment of the present invention.

FIG. 28 illustrates one way of attaching the shutter member 1150 to the underside of the seal member 1012. This method usefully makes use of the seal 1016 of the seal member 1012. The outlet 1014 is energized and the (gas) inlet 1015 is not energized when the shutter member 1150 is positioned under the aperture. The vacuum provided in the outlet 1014 is enough to attract the shutter member 1150 to be clamped to the bottom of the seal member 1012 thereby sealing the aperture. When the shutter member 1150 is replaced on the substrate table AWT, the seal 1016 can be reactivated to operate as normal and the substrate table AWT moved to the expose position. The shutter member 1150 may be held on the substrate table AWT by use of vacuum outlet 1157 connected to a vacuum source through a duct 1155. To avoid or reduce immersion liquid leakage under the shutter member 1150, a (annular) channel 1158 is provided around the vacuum outlet 1157. The channel 1158 is connected via a duct 1159 to a vacuum source so that any liquid is removed by the flow of gas through the channel 1158 caused by the vacuum. It might be advantageous to have a flow of gas in the channel 1158, even when the shutter member 1150 is in place. To this end a duct 1156 open at a surface, for example the top surface of the substrate table AWT, and connected to the channel 1158 can be provided on a side substantially opposite to the duct 1159 leading to the vacuum source. In the fifteenth embodiment, the seal 1016 need not be activated while the shutter member 1150 is positioned to cover the aperture but, in an embodiment, is activated.

Figure 29:
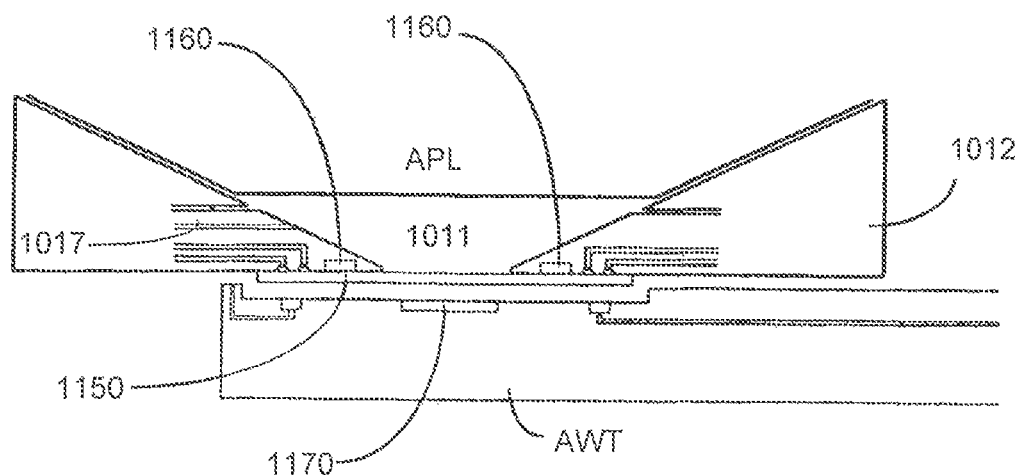
FIG. 29 illustrates an alternative arrangement of the fourteenth embodiment of liquid reservoir, substrate table and shutter member of the present invention.

An alternative means for holding the shutter member 1150 to the substrate table AWT and means for attaching the shutter member 1150 to the seal member 1012, is illustrated in FIG. 29. In this embodiment the shutter member 1150 is made of a ferromagnetic material (or partly of ferromagnetic material by making an assay) such that magnets 1160, 1170 (in an embodiment, electromagnets for easy attachment and detachment) positioned on the seal member 1012 and substrate table AWT may be used to hold the shutter member 1150 in position against the seal member 1012 and substrate table AWT respectively. By keeping seal 1016 activated, loss of liquid can be minimized. The channel 1158 and duct 1156, 1159 arrangement described in relation to the FIG. 28 embodiment may also be employed in the FIG. 29 embodiment to reduce or alleviate liquid leakage under the shutter member 1150.

The shutter member 1150 should be held by at least one of the substrate table AWT and the seal member 1012 so that the shutter member 1150 is under control.

As it is further illustrated in FIG. 29, it may be desirable to remove liquid 1011 from the reservoir 1010 during substrate exchange. This is done by extracting the liquid either through the outlet 1014 or the outlet duct 1013 (see, e.g., FIGS. 28 and 25 respective) and then flushing the space with gas provided through a further gas inlet 1017. This might be done for maintenance and the lens may need to be cleaned after this process.

Of course, features from both FIGS. 28 and 29 can be combined.

Embodiment 16

Figure 30:
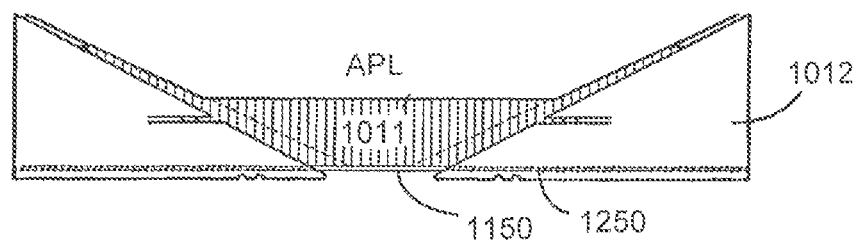
FIG. 30 illustrates a sixteenth embodiment of the present invention.

A sixteenth embodiment is the same as the fifteenth embodiment except as described below. The sixteenth embodiment is illustrated in FIG. 30 and differs from the fifteenth embodiment in that the shutter member 1150 is placed within the seal member 1012. The similarity with the fifteenth embodiment lies in the fact that the shutter member is separate from the substrate table AWT. The shutter member 1150 can be moved from any resting position to block the aperture by being moved under the projection system APL through channels 1250 in the seal member 1012.

Figure 31:
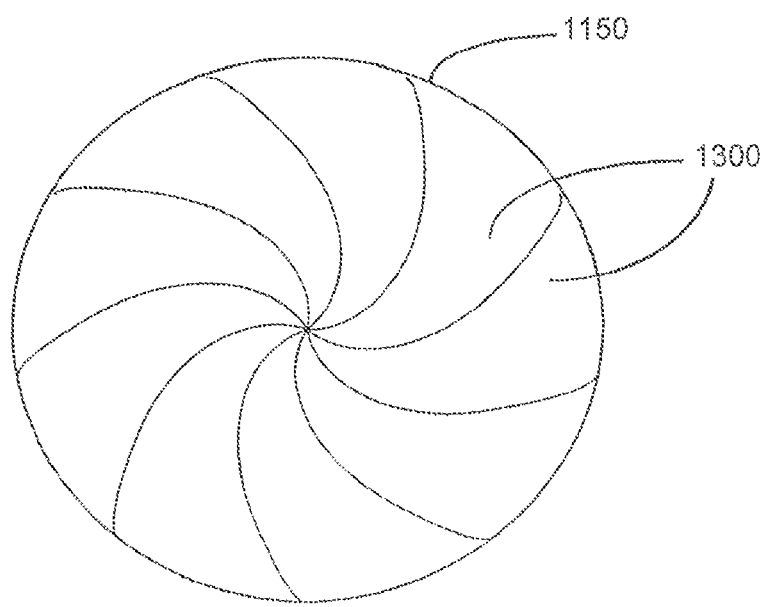
FIG. 31 illustrates a variant of the sixteenth embodiment.

The shutter member 1150 may either be separate from the seal member 1012 and moved into the seal member 1012 at the required time by a robotic arm, for example, or the shutter member may have a series of leafs 1300 as illustrated in FIG. 31. The leafs 1300 work like a shutter of a camera in that the leafs can be moved such that they do not obstruct the aperture but, when the plurality of leafs are moved to abut at the center of the aperture they thereby block the aperture.

Embodiment 17

Figure 34:
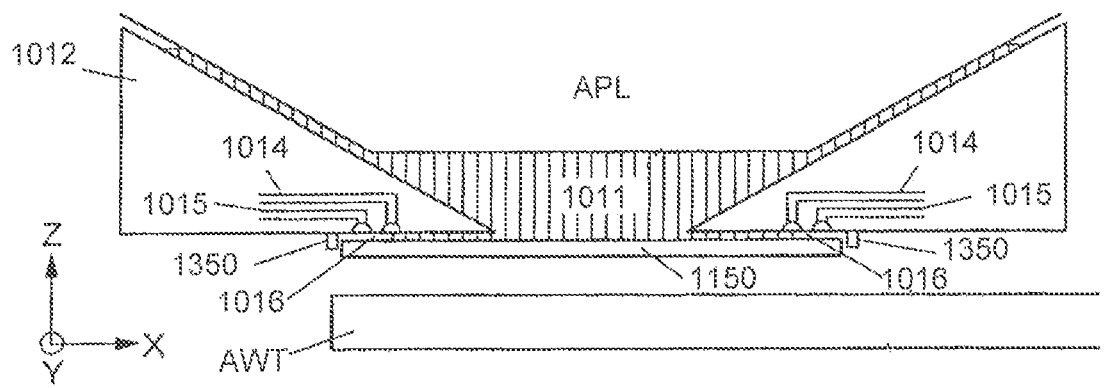
FIG. 34 depicts the liquid reservoir, substrate table and shutter member of a seventeenth embodiment of the present invention.
Figure 35:
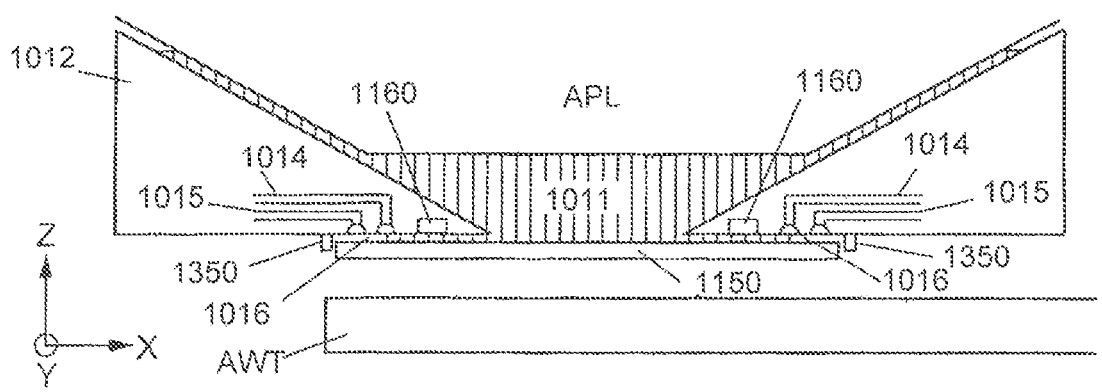
FIG. 35 illustrates an alternative arrangement of the seventeenth embodiment of liquid reservoir, substrate table and shutter member of the present invention.

A seventeenth embodiment is the same or similar as the fifteenth embodiment except as described below. The seventeenth embodiment is illustrated in FIGS. 34 and 35. In this embodiment, the shutter member 1150 is in the form of a plate but the shutter member 1150 does not come into contact with the bottom surface of the seal member 1012. An advantage of not having the shutter member 1150 come into contact with the seal member 1012 is that it eliminates or at least reduces the chances of contaminating particles being generated from contact of the shutter member 1150 with the seal member 1012. Once positioned under the projection system APL, the shutter member 1150 is connected to the bottom of the seal member 1012, as, for example, implemented below, to cover the aperture in the seal member 1012.

In an implementation, as shown in FIG. 34, the shutter member 1150 is connected to the underside of the seal member 1012 using the seal 1016 of the seal member 1012. Both the outlet 1014 and the (gas) inlet 1015 remain energized when the shutter member 1150 is positioned under the aperture. However, the gas flow is adjusted so that there is enough vacuum provided in the outlet 1014 to attract the shutter member 1150 toward the bottom of the seal member 1012 but enough gas flow provided to inlet 1015 to maintain a gap between the bottom of the seal member 1012 and the shutter member 1150. The gas flow in the seal 1016 also can be sufficient to confine the liquid 1011 in the liquid reservoir 1010 while the shutter member 1150 is connected to the seal member 1012. When the shutter member 1150 is replaced on the substrate table AWT or other location, the gas flow in the seal 1016 can be re-adjusted to operate as normal so as to release the shutter member 1150.

In another implementation, as shown in FIG. 35, the shutter member 1150 may be made of a ferromagnetic material (or partly of ferromagnetic material) such that magnets 1160 (in an embodiment, electromagnets for easy connection and de-connection) positioned on the seal member 1012 may be used to connect the shutter member 1150 to the seal member 1012. In an example, the attraction between the magnets 1160 and the shutter member 1150 is configured so as to maintain a gap between the bottom of the seal member 1012 and the shutter member 1150. Alternatively or in addition, the gas flow of seal 1016 may be adjusted so as to maintain the gap between the bottom of the seal member 1012 and the shutter member 1150. Where liquid 1011 is present in the liquid reservoir 1010, the gas flow in the seal 1016 also can be sufficient to confine the liquid 1011 in the liquid reservoir 1010 while the shutter member 1150 is connected to the seal member 1012.

Referring to FIGS. 34 and 35, one or more projections 1350 may be provided on the seal member 1012 to restrict the position of the shutter member 1150 in the X-Y plane. In a typical arrangement, a plurality of projections 1350 are provided on the bottom surface of the seal member 1012 and are located such that they would be outward of the periphery of the shutter member 1150 when the shutter member 1150 is connected to the seal member 1012. The projection 1350 may also be in the form a ring or other peripheral arrangement that is outward of the periphery of the shutter member 1150 when the shutter member 1150 is connected to the seal member 1012. In an embodiment, three projections 1350 are provided in a triangular layout to determine the shutter member 1150 in the X-Y plane. In an embodiment, the projection(s) 1350 is retractable so as to eliminate or at least reduce the chance that the projection(s) 1350 deleteriously contacts the substrate table AWT, the substrate or any other part of the lithographic apparatus.

Embodiment 18

Figure 36:
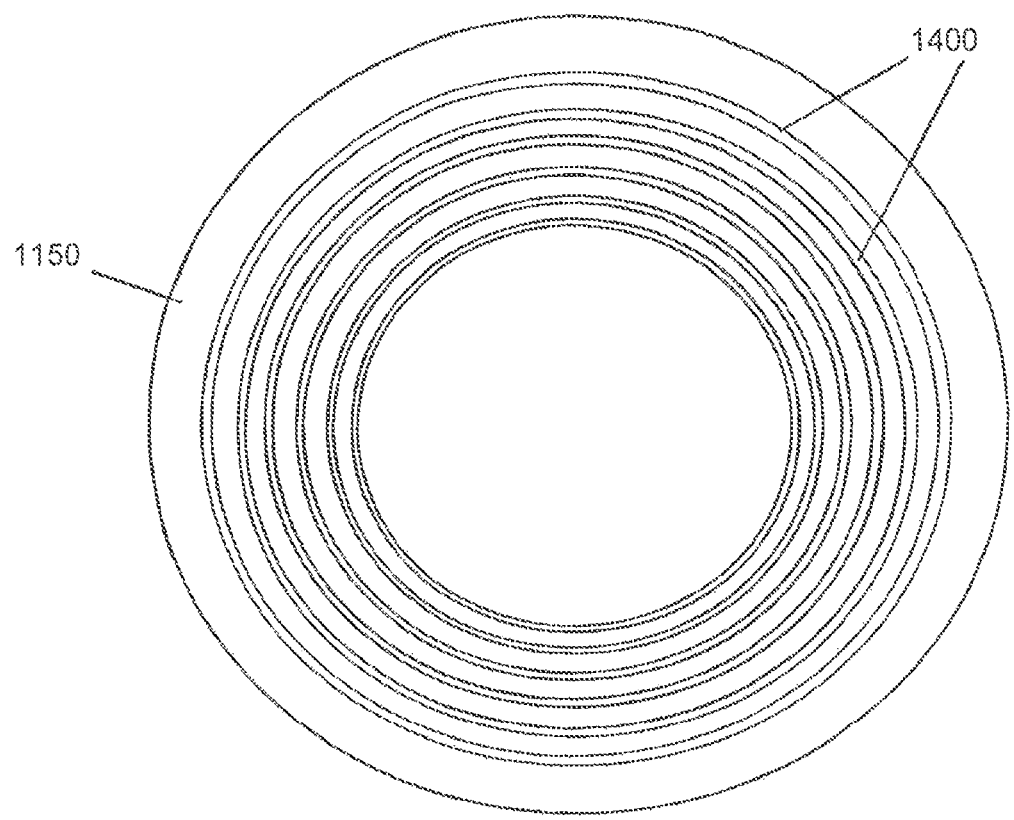
FIG. 36 illustrates a top view of a shutter member according to a eighteenth embodiment of the present invention.
Figure 37:
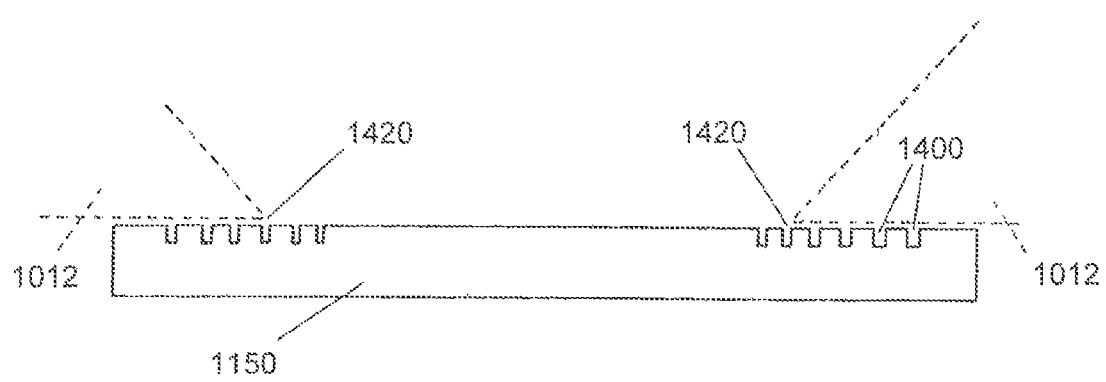
FIG. 37 illustrates a side view of a shutter member according to a eighteenth embodiment of the present invention.
Figure 38:
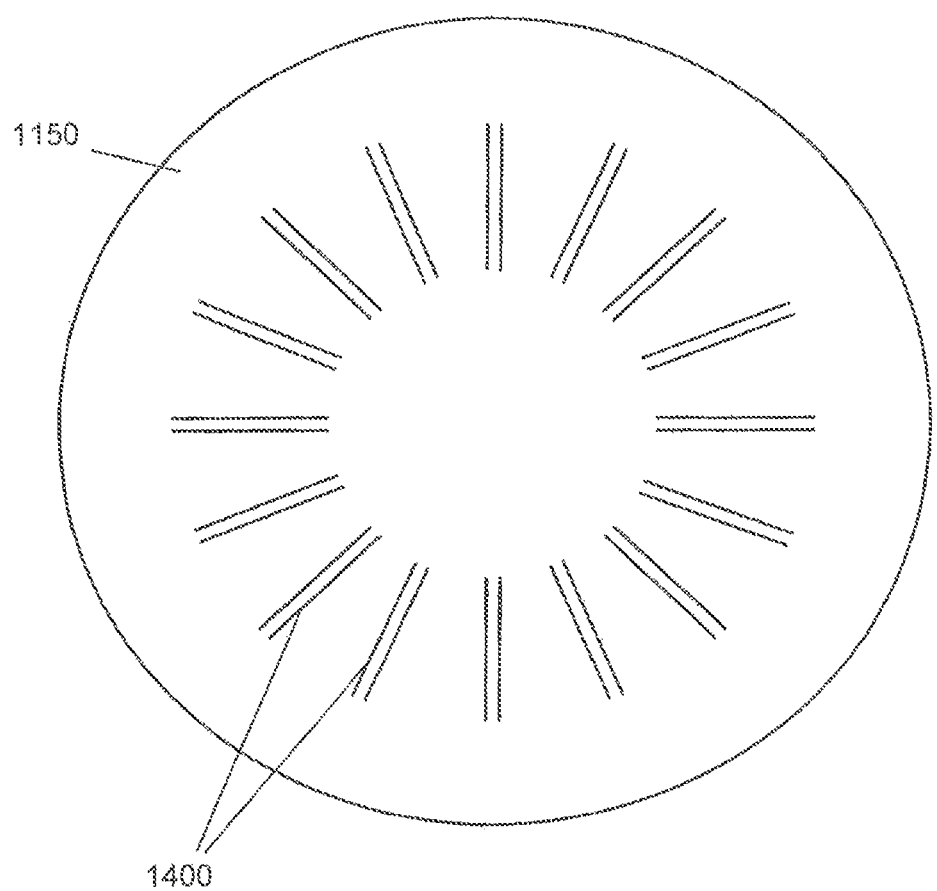
FIG. 38 illustrates a top view of a shutter member according to a eighteenth embodiment of the present invention.

FIGS. 36, 37 and 38 depict an embodiment of the shutter member 1150 of, for example, any or all of the foregoing embodiments. In FIG. 37, the position of the seal member 1012 is generally shown by dashed lines.

In some situations, the liquid 1011 in the liquid reservoir 1010 may comprise contaminating particles, such particles coming into the liquid, for example, through the physical contact of the seal member 1012 and the shutter member 1150. So, in a situation where the shutter member 1150 is attached to or connected to the seal member 1012 and the seal 1016 is maintained in whole (both gas supply and gas removal of the seal 1016 are activated) or in part (only gas removal of the seal 1016 is activated), particles may be attracted to, and possibly trapped in, the inner interface 1420 between the seal member 1012 and the shutter member 1150 due to liquid flow outwards caused by the gas removal of the seal 1016 between the shutter member 1150 and the seal member 1012.

So, in this embodiment, the shutter member 1150 is provided with one or more channels 1400, the channels 1400 being provided at least on the shutter member 1150 at the location on the shutter member 1150 of the inner interface 1420 between the seal member 1012 and the shutter member 1150. Through the use of channels, the contact area at the inner interface 1420 of the seal member 1012 and the shutter member 1150 can be reduced and thus, for example, reducing the chances of particles being created through contact between the shutter member 1150 and the seal member 1012. Further, liquid flow through the channels when the shutter member 1150 is connected to the seal member 1012 can help to reduce trapping of particles that are smaller in diameter than the channel depth and/or width.

In an implementation, the channels 1400 are 1 to 10 micrometers deep. Where the shutter member 1150 is attached to or connected to the seal member 1012 through the vacuum of the seal 1016, the depth of the channels should be made such that enough vacuum remains to keep the shutter member 1150 in place.

In FIG. 36, the shutter member 1150 is a circular disk and the channels 1400 are depicted as concentric circular channels provided only on the shutter member 1150 in the general location on the shutter member 1150 of the inner interface 1420 between the seal member 1012 and the shutter member 1150. In other implementations, the shutter member 1150 and/or the channels 1400 may be in other shapes such as rectangular. Further, the channels 1400 may be provided over the entirety of the shutter member 1150.

In FIG. 37, the channels 1400 are depicted having a rectangular profile. In an implementation, the channels 1400 may have different profiles such as semi-circular. Furthermore, the number of channels 1400 may vary although in an embodiment, the number of channels is high, at least at the inner interface 1420, to promote greater flow and reduced contact area.

In FIG. 38, the shutter member 1150 is a circular disk and the channels 1400 are depicted as radial channels provided only on the shutter member 1150 in the general location on the shutter member 1150 of the inner interface 1420 between the seal member 1012 and the shutter member 1150. In other implementations, the shutter member 1150 may be in another shape such as rectangular. Further, the channels 1400 may be provided over the entirety of the shutter member 1150. Also, as with FIG. 37, the profile may have a rectangular or other different profile and the number of channels 1400 may vary although in an embodiment, the number of channels is high, at least at the inner interface 1420, to promote greater flow and reduced contact area. Where, for example, a seal 1016 is employed, with radial channels, a small liquid flow of liquid 1011 towards the seal 1016 is provided. This liquid flow may rinse the shutter member 1150 and prevent or reduce trapping of particles at interface 1420 since these particles can be removed by the liquid or kept in the liquid.

In an embodiment, shutter member 1150 contacts seal member 1012 to position seal member 1150 in a horizontal plane. Alternatively, the shutter member 1150 may be displaced from seal member 1012 as described above and some other means such as projections 1350 may be used to keep shutter member 1150 in place.

In an embodiment, the channels may include projections (e.g., pimples) to provide mechanical connection of the shutter member 1150 to the seal member 1012 and/or to prevent or reduce possible bending of the shutter member 1150.

Embodiment 19

Figure 39:
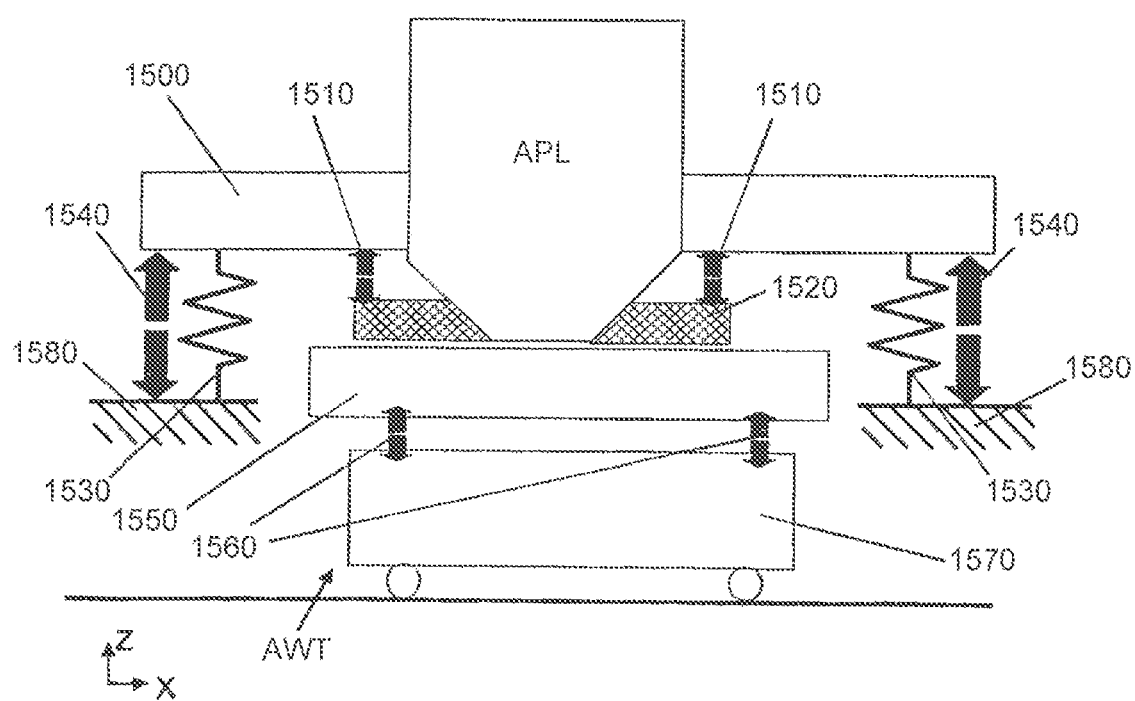
FIG. 39 illustrates a simplified layout of part of an immersion lithographic projection apparatus according to a nineteenth embodiment of the present invention.

Referring to FIG. 39, a simplified layout of part of an immersion lithographic projection apparatus is depicted according to an embodiment of the invention. In the layout, a projection system APL is connected to a projection system frame 1500. The projection system frame 1500 is supported on a base frame or ground 1580 by a mount 1530, 1540, the mount comprising a spring 1530 and a projection system frame actuator 1540. In an embodiment, the mount may comprise a damper and one or more position sensors to provide position information used to control the projection system frame actuator 1540. The projection system frame actuator 1540 need not be part of the mount and could be separately provided and connected to the projection system frame 1500. The projection system frame 1500 is isolated from the base frame or ground 1500 so that the projection system APL can be kept substantially free from vibrations.

A member 1520 (such as the seal member 1012 described herein) of the liquid supply system is connected to the projection system frame 1500. In an embodiment, the member 1520 is connected to the projection system frame 1500 by a liquid supply member actuator 1510, which can displace the member 1520 in a direction substantially parallel to the Z direction (e.g., the direction of the optical axis of the projection system APL). Alternatively or additionally, the member 1520 may be flexibly connected to the projection system frame 1500 by a coupling (not shown). The part of the lithographic apparatus depicted in FIG. 39 further comprises a substrate table AWT, which in this case comprises a substrate holder 1550 supported by a substrate stage 1570, the substrate holder 1550 being connected and displaceable relative to the substrate stage 1570 by a substrate holder actuator 1560. The substrate holder 1550 holds a substrate AW (not shown). In an embodiment, the liquid supply member actuator 1510 and/or the substrate holder actuator 1560 may have one or more dampers associated therewith. Also, or alternatively, one or more position sensors may be provided to supply position information used to control the liquid supply member actuator 1510 and/or the substrate holder actuator 1560. For example, an interferometer may be provided to measure the position of the substrate table AWT with respect to the projection system frame 1500.

During exposure of the substrate AW, the member 1520 is supported on the substrate holder 1550 (whether directly or indirectly via the substrate AW) so that the weight of the member 1520 is carried by the substrate holder 1550 (and the substrate table AWT generally) when no gravity compensation of the member 1520 is provided. Before or after exposure of the substrate AW, the member 1520 is displaced relative to the substrate holder 1550 (e.g., by the liquid supply member actuator 1510 displacing the member 1520 away from the substrate holder 1550, by the substrate holder actuator 1560 displacing the substrate holder 1550 away from the member 1520 or a combination of both) so that the substrate AW can be removed from or provided to the substrate holder 1550 as appropriate.

The transfer of the weight of the member 1520 between the substrate holder 1550 and the projection system frame 1500 may deform the relatively weak springs 1530 supporting at least part of the projection system frame 1500. Due to a very low stiffness of the projection system frame 1500, the weight transfer may introduce a relatively large displacement and temporarily instability of the system. Since the projection system frame actuator 1540 typically has a low frequency, the projection system frame actuator 1540 may not be able to compensate for the weight transfer in time resulting in a movement of the projection system frame 1500. Such movement may cause measurement errors, exposure errors and/or failure, or any combination.

Accordingly, in an embodiment, the force for supporting the substrate holder 1550 and the member 1520 is measured or determined before the member 1520 is displaced from the substrate holder 1550. For example, the force of the substrate holder actuator 1560 used to support the substrate holder 1550 and the member 1520 may be measured. Similarly, the force for supporting the member 1520 is measured or determined before the member 1520 is displaced to the substrate holder 1550. For example, the force of the liquid supply member actuator 1510 used to hold the member 1520 may be measured.

When the member 1520 is displaced relative to the substrate holder 1550 so that the member 1520 is no longer supported on the substrate holder 1550, the force for keeping the substrate holder 1550 in place (for example, the force of the substrate holder actuator 1560) will decrease due to the reduction of weight. However, the force for supporting the projection system frame 1500, e.g., the force of the projection system frame actuator 1540 used to support the projection system frame 1500, will increase by substantially the same amount as needed to support the member 1520 on the substrate holder 1550. So, to keep the projection system frame 1500 in place, the force of the projection system frame actuator 1540, for example, should increase to prevent or at least reduce the projection system frame 1500 from lowering due to the weight of the member 1520 it now carries.

Similarly, when the member 1520 is displaced relative to the substrate holder 1550 so that the member 1520 is supported on the substrate holder 1550, the force for holding the member 1520 in place (for example, the force of the liquid supply member actuator 1510) will decrease due to the reduction of weight. So, the force for supporting the projection system frame 1500, e.g., the force of the projection system frame actuator 1540 used to support the projection system frame 1500, will also decrease by substantially the same amount as needed to hold the member 1520 on projection system frame 1500. So, to keep the projection system frame 1500 in place, the force of the projection system frame actuator 1540, for example, should decrease to prevent or at least reduce the projection system frame 1500 from raising due to the weight of the member 1520 it no longer carries.

The additional or reduced force needed, as appropriate, for the projection system frame actuator 1540, as an example, may be determined from the change of force to support the substrate holder 1550, e.g., the change of force in the substrate holder actuator 1560, and/or the change of force to hold the member 1520, e.g., the change of force in the liquid supply member actuator 1510. The change of force can be measured, for example, by a force sensor. Alternatively or additionally, the change of force can be determined from errors and corrections generated in the control loops of any or all of the various actuators, e.g., the projection system frame actuator 1540, the liquid supply system actuator 1510 and/or the substrate holder actuator 1560. The actuators then act essentially as a pair of scales to measure the weight of the part of the liquid supply system transferred between the projection system frame 1500 and the substrate table AWT.

Alternatively or additionally, the additional or reduced force needed, as appropriate, may be determined from information about the weight transfer between the projection system frame 1500 and the substrate table AWT, including, for example, a calculation based on the mass of the member 1520, the mass of the substrate holder 1550, the mass of the projection system frame 1500 and/or other physical characteristics of the lithography apparatus.

In each circumstance, the change of force can be used in a feed-forward or feedback manner. For example, the additional or reduced force for the projection system frame actuator 1540, derived, for example, from the change of force in the substrate holder actuator 1560 or the liquid supply member actuator 1510, can be fed forward to the projection system frame actuator 1540 so as to prevent or at least reduce the raising or lowering, as appropriate, of the projection system frame 1500. A feed-forward loop may prevent the projection system frame 1500 from lowering or raising since the feed-forward signal may be of relatively high-frequency while the band-width of the projection system frame actuator 1540 typically has a low frequency.

A controller (not shown) may be provided to obtain appropriate measurements and data (e.g., force measurements from a force sensor and/or data from actuator control loops) and to make the appropriate determinations (e.g., by calculation or table look-up) of a change of force attributable to the weight transfer and/or the corresponding force to be applied to the projection system frame 1500 to compensate for the weight transfer. The controller may be electronic, mechanical, software based, or any combination thereof. In an embodiment, the controller is a software program of the lithographic apparatus.

In short, the transfer of the weight of a part of the liquid supply system between the projection system frame 1500 and the substrate table AWT can be determined and/or measured. A signal representative of the weight transfer can be fed forward (or fed back) into the control signal of the projection system frame mount 1530, 1540 to prevent or at least reduce low frequency movements of the projection system frame 1500 having large position overshoots. Advantageously, settling time for the system may be reduced and the stability of the projection system may be improved.

The embodiments herein have been described in relation to the seal member variant of the localized area solution. However, the embodiments as described herein are equally applicable to any other type of liquid supply for example those disclosed in European Patent application nos. 03254078.3 or 03256643.2 hereby incorporated in their entirety by reference or to the variant illustrated in FIGS. 32 and 33. For example, in the case of a shutter member 1150 moveable relative to both the substrate table AWT and the projection system APL, means for attaching the shutter member below the in- and outlets BIN, BOUT may be attached to the members forming the in-and-out-lets BIN, BOUT, or to a separate structure. Additionally or alternatively, the vacuum of the outlets BOUT can be used to attract the shutter member to the in- and outlets BIN, BOUT and thereby seal the aperture. It may be desirable to use a non-flat shutter member e.g. one with a protruding border so that any drips of liquid from the various in-and out-lets are contained. Any system for generating a force can be used for the means for attaching, including low pressure sources, magnetic means, mechanical means, electro static means, etc.

While specific embodiments of the invention have been described above, it will be appreciated that the invention may be practiced otherwise than as described. The description is not intended to limit the invention.

The invention claimed is:

1. A substrate support configured to support a substrate in a lithographic apparatus having a substrate stage to support the substrate and a projection system configured to project a beam of radiation onto the substrate when supported on the substrate support, the substrate support comprising:
   a body to support the substrate, the body comprising:
      a first side of the body having a plurality of first protrusions, and
      a second side of the body opposite to the first side, the second side configured to removably support the body on the substrate stage and comprising a plurality of second protrusions configured to removably support the body on the substrate stage; and
   a wall enclosing at least the plurality of first protrusions and enclosing an opening for connection to a vacuum source for holding the substrate on the first protrusions.

2. The support of claim 1, wherein the body comprises a further protruding portion surrounding the plurality of first protrusions and located inward, relative to the center of the body, of the wall such that the wall surrounds the further protruding portion.

3. The support of claim 2, further comprising an opening to drain fluid, the opening located between the wall and the further protruding portion.

4. The support of claim 1, wherein the body further comprises a port at the outer periphery of the body, the port configured to drain fluid into the body.

5. The support of claim 4, wherein the port is connected to a drain hole at the second side of the body.

6. A substrate stage comprising the support of claim 1, wherein the body is configured such that a surface of the substrate when supported on the support is essentially coplanar with a surface outward of the substrate.

7. An immersion lithographic projection apparatus comprising:
   the support according to claim 1; and
   a projection system configured to project a beam of radiation onto a substrate when supported on the support.

8. A substrate support configured to support a substrate in a lithographic apparatus having a substrate stage to support the substrate and a projection system configured to project a beam of radiation onto the substrate when supported on the substrate support, the substrate support comprising:
   a body to support the substrate, the body comprising:
      a first side of the body having a plurality of first protrusions, and
      a second side of the body opposite to the first side, the second side configured to removably support the body on the substrate stage;
   a wall enclosing at least the plurality of first protrusions; and
   a ring inwards, relative to a center of the body, of the wall, wherein at least one burl is between the wall and the ring.

9. The support of claim 8, further comprising an opening to drain fluid, the opening located between the wall and the ring.

10. The support of claim 8, wherein the body further comprises a port at the outer periphery of the body, the port configured to drain fluid into the body.

11. The support of claim 10, wherein the port is connected to a drain hole at the second side of the body.

12. The support of claim 8, wherein the second side comprises a plurality of second protrusions configured to removably support the body on the substrate stage.

13. A substrate stage comprising the support of claim 8, wherein the body is configured such that a surface of the substrate when supported on the support is essentially coplanar with a surface outward of the substrate.

14. An immersion lithographic projection apparatus comprising:
   the support according to claim 8; and
   a projection system configured to project a beam of radiation onto a substrate when supported on the support.

15. A substrate support configured to support a substrate in a lithographic apparatus having a substrate stage to support the substrate and a projection system configured to project a beam of radiation onto the substrate when supported on the substrate support, the substrate support comprising:
   a body to support the substrate, the body comprising:
      a first side of the body having a plurality of first protrusions, and
      a second side of the body opposite to the first side, the second side configured to removably support the body on the substrate stage; and
   a first sealing structure located between the body and the substrate when supported on the body;
   a second sealing structure located between the body and the substrate when supported on the body, the first and/or second sealing structure being immovable relative to the body; and
   a port located between the first and second sealing structures.

16. The support of claim 15, wherein the port configured to drain fluid into the body.

17. The support of claim 16, wherein the port is connected to a drain hole at the second side of the body.

18. The support of claim 15, wherein the second side comprises a plurality of second protrusions configured to removably support the body on the substrate stage.

19. An immersion lithographic projection apparatus comprising:
   the support according to claim 15; and
   a projection system configured to project a beam of radiation onto a substrate when supported on the support.

20. A substrate support configured to support a substrate in a lithographic apparatus having a substrate stage to support the substrate and a projection system configured to project a beam of radiation onto the substrate when supported on the substrate support, the substrate support comprising:
- a body to support the substrate, the body comprising:
  - a first side of the body having a plurality of first protrusions,
  - a second side of the body opposite to the first side, the second side configured to removably support the body on the substrate stage and comprising a plurality of second protrusions configured to removably support the body on the substrate stage,
  - a port configured to drain fluid into the body, the port connected to a drain hole at the second side of the body; and
- a wall enclosing at least the plurality of first protrusions and enclosing an opening for connection to a vacuum source for holding the substrate on the first protrusions.

* * * * *

UNITED STATES PATENT AND TRADEMARK OFFICE
CERTIFICATE OF CORRECTION

PATENT NO. : 10,962,891 B2
APPLICATION NO. : 16/707525
DATED : March 30, 2021
INVENTOR(S) : Joeri Lof et al.

Page 1 of 1

It is certified that error appears in the above-identified patent and that said Letters Patent is hereby corrected as shown below:

On the Title Page

Item (72) Inventors, Column 1, Line 22, correct "Timotheus Franciscus Sengers, 's-Hertogenborsch (SA)" to --Timotheus Franciscus Sengers, 's-Hertogenbosch (NL)--.

Item (56) References cited FOREIGN PATENT DOCUMENTS, Column 2, Line 29, correct "DE 2474708 07/1981" to --FR 2474708 07/1981--.

Item (56) References cited FOREIGN PATENT DOCUMENTS, page 3, Column 2, Line 58, please add --DE 221563 04/1985--.

Item (56) References cited FOREIGN PATENT DOCUMENTS, page 3, Column 2, Line 59, please add --DE 242880 02/1987--.

Item (56) References cited FOREIGN PATENT DOCUMENTS, page 3, Column 2, Line 60, please correct "DE 03/085708 10/2003" to --WO 03/085708 10/2003--.

Item (56) References cited FOREIGN PATENT DOCUMENTS, page 4, Column 1, Line 42, please correct "JP 2004/019128 03/2004" to --WO 2004/019128 03/2004--.

Signed and Sealed this
Tenth Day of August, 2021

Drew Hirshfeld
*Performing the Functions and Duties of the
Under Secretary of Commerce for Intellectual Property and
Director of the United States Patent and Trademark Office*